(12) United States Patent
Yokota

(10) Patent No.: US 12,097,812 B2
(45) Date of Patent: Sep. 24, 2024

(54) WIRE HARNESS

(71) Applicant: SUMITOMO WIRING SYSTEMS, LTD., Yokkaichi (JP)

(72) Inventor: Manai Yokota, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 113 days.

(21) Appl. No.: 17/798,634

(22) PCT Filed: Feb. 17, 2021

(86) PCT No.: PCT/JP2021/005792
§ 371 (c)(1),
(2) Date: Aug. 10, 2022

(87) PCT Pub. No.: WO2021/172118
PCT Pub. Date: Sep. 2, 2021

(65) Prior Publication Data
US 2023/0091092 A1    Mar. 23, 2023

(30) Foreign Application Priority Data
Feb. 25, 2020    (JP) .................................. 2020-029720

(51) Int. Cl.
*B60R 16/02*    (2006.01)
*H02G 3/04*    (2006.01)
*H05K 9/00*    (2006.01)

(52) U.S. Cl.
CPC ....... *B60R 16/0215* (2013.01); *H02G 3/0468* (2013.01); *H05K 9/0098* (2013.01)

(58) Field of Classification Search
CPC ................ H01B 7/0045; B60R 6/0207; B60R 6/0215; H05K 9/00; H05K 9/0007; H05K 9/0018; H05K 9/066; H05K 9/0098
See application file for complete search history.

(56) References Cited

U.S. PATENT DOCUMENTS 2,932,805 A * 4/1960 Doherty .................. H01B 7/306
                                                    333/243
5,763,825 A * 6/1998 Gilliland ................ H01B 11/16
                                                    333/243
5,900,796 A * 5/1999 Parker .................. H03H 1/0007
                                                    336/212

(Continued)

FOREIGN PATENT DOCUMENTS

JP    2013-240244 A    11/2013
JP    2016-201240 A    12/2016

OTHER PUBLICATIONS

May 11, 2021 International Search Report issued in International Patent Application No. PCT/JP2021/005792.

*Primary Examiner* — Paresh Paghadal
(74) *Attorney, Agent, or Firm* — Oliff PLC

(57) ABSTRACT

A wire harness including: a wire; a ring-shaped electromagnetic wave absorber including a through hole through which the wire passes; and a fixing member for fixing the electromagnetic wave absorber to the wire, wherein: an inner circumferential surface of the through hole opposes an outer circumferential surface of the wire, in a view of the electromagnetic wave absorber along a central axis of the through hole, the inner circumferential surface of the through hole has a first portion and a second portion arranged at a position point-symmetrical to the first portion with respect to the central axis of the through hole, and the fixing member fixes the electromagnetic wave absorber to the wire such that the wire is in contact with the first portion and is separated from the second portion.

7 Claims, 13 Drawing Sheets

(56) References Cited

U.S. PATENT DOCUMENTS

| | | | |
|---|---|---|---|
| 5,990,756 A * | 11/1999 | France, Jr. | H01F 17/06 |
| | | | 336/175 |
| 6,156,973 A | 12/2000 | Ushiyama et al. | |
| 2014/0182922 A1 | 7/2014 | Imahori et al. | |
| 2015/0289423 A1 | 10/2015 | Imahori et al. | |
| 2016/0362074 A1* | 12/2016 | Yamaguchi | B60R 16/0215 |
| 2018/0233263 A1 | 8/2018 | Mizutani | |

* cited by examiner

WIRE HARNESS

BACKGROUND

This disclosure relates to a wire harness.

Conventionally, wire harnesses, which are provided with wires that electrically connect a plurality of electrical devices and electromagnetic wave absorbing members that absorb electromagnetic waves (electromagnetic noise) emitted from the wires, are known as wire harnesses that are mounted in vehicles such as hybrid vehicles and electric vehicles. As a result of inserting a plurality of wires into a through hole in an electromagnetic wave absorbing member constituted by a ferrite core, the electromagnetic wave absorbing member is provided on an outer circumference of the wires in a wire harness of this type (see JP 2014-130886A, for example).

SUMMARY

Incidentally, in the above-described wire harness, the larger the electromagnetic waves to be reduced are, the larger the size of the electromagnetic wave absorbing member is. When a wire is passed through the electromagnetic wave absorbing member that has been increased in size in this way, the electromagnetic wave absorbing member vibrates due to vibration accompanying, for example, traveling of the vehicle or the like, and the wire is shaken by the vibration of the electromagnetic wave absorbing member. At this time, the wire may wear and be damaged due to contact between the inner circumferential surface of the through hole of the electromagnetic wave absorbing member and the wire.

An exemplary aspect of the disclosure provides a wire harness capable of suppressing damage to a wire.

The wire harness of the present disclosure includes: a wire; a ring-shaped electromagnetic wave absorber including a through hole through which the wire passes; and a fixing member for fixing the electromagnetic wave absorber to the wire, wherein: an inner circumferential surface of the through hole opposes an outer circumferential surface of the wire, in a view of the electromagnetic wave absorber along a central axis of the through hole, the inner circumferential surface of the through hole has a first portion and a second portion arranged at a position point-symmetrical to the first portion with respect to the central axis of the through hole, and the fixing member fixes the electromagnetic wave absorber to the wire such that the wire is in contact with the first portion and is separated from the second portion.

According to the wire harness of the present disclosure, an effect of being able to suppress damage to a wire is exhibited.

DETAILED DESCRIPTION OF EMBODIMENTS

Description of Embodiments

Figure 1:
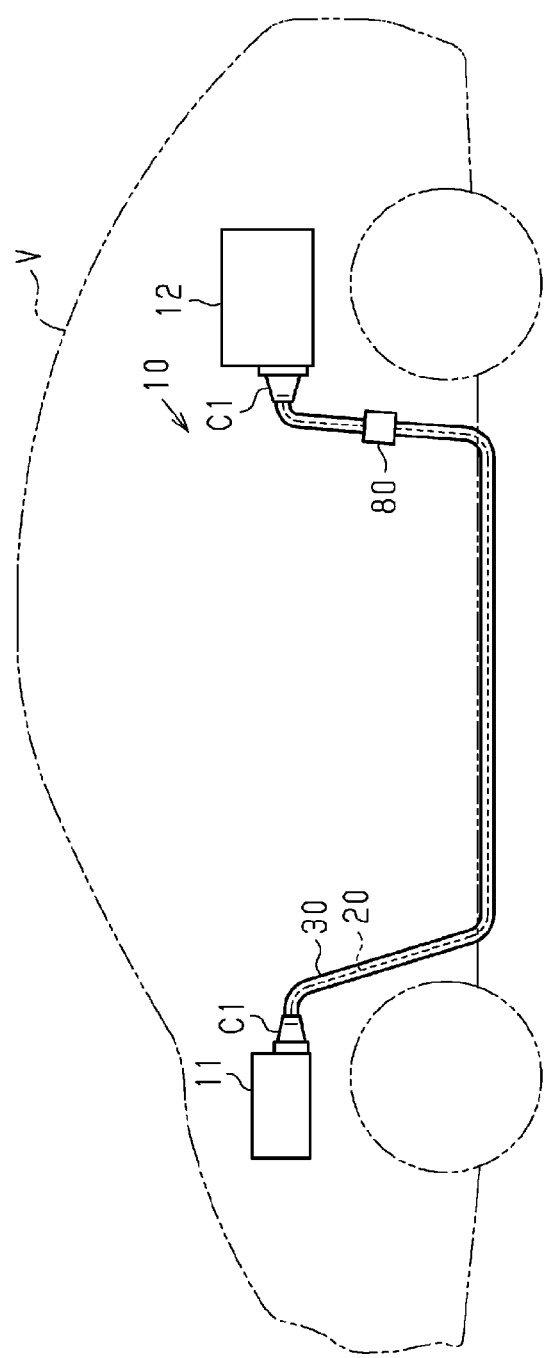
FIG. 1 is a schematic configuration diagram showing a wire harness according to an embodiment.

First, embodiments of the present disclosure will be listed and described.

[1] The wire harness of the present disclosure includes: a wire member; a ring-shaped electromagnetic wave absorbing member including a through hole through which the wire member passes; and a fixing member for fixing the electromagnetic wave absorbing member to the wire member, in which an inner circumferential surface of the through hole opposes an outer circumferential surface of the wire member, in a view of the electromagnetic wave absorbing member along a central axis of the through hole, the inner circumferential surface of the through hole has a first portion and a second portion arranged at a position point-symmetrical to the first portion with respect to the central axis of the through hole, and the fixing member fixes the electromagnetic wave absorbing member to the wire member such that the wire member is in contact with the first portion and is separated from the second portion.

According to this configuration, inside the through hole of the electromagnetic wave absorbing member, the electromagnetic wave absorbing member and the wire member are fixed (integrated) in a state where the wire member is in contact with the first portion and is arranged offset to the first portion side. For this reason, even if the electromagnetic wave absorbing member vibrates accompanying traveling of the vehicle or the like, it is possible to suppress shaking of the wire member in the through hole caused by vibration of the electromagnetic wave absorbing member. It is possible to suppress movement of the wire member in the through hole caused by vibration of the electromagnetic wave absorbing member compared to the case where, for example, the electromagnetic wave absorbing portion and the wire member are fixed in a state where the wire member is not in contact with the inner circumferential surface of the through hole of the electromagnetic wave absorbing member. As a result, it is possible to suppress wearing of the wire member caused by contact with the inner circumferential surface of the through hole, and it is possible to suppress damage to the wire member caused by vibration of the electromagnetic wave absorbing member. Consequently, it is possible to suppress damage to the wire.

Here, a "ring" in the present specification includes a circular ring having a circular outer edge shape, a ring having an elliptical or ovoid outer edge shape, a polygonal ring having a polygonal outer edge shape, and a ring having a polygonal outer edge shape with rounded corners, and refers to a ring whose outer shape is composed of any closed shape connected by straight lines or curved lines. A "ring" includes a ring that is a shape having a through hole in a plan view, a shape in which the outer edge shape and the inner circumference shape of the through hole are the same shape, and a shape in which the outer edge shape and the inner circumference shape of the through hole are different from each other. A "ring" includes a ring having a predetermined length extending along the central axis direction in which the central axis passing through the center of the through hole extends, and the length thereof may be large or small. Also, a "ring" in the present specification may be regarded as a ring overall, and includes an object having a notch in a portion thereof, as with a C-shaped object.

Also, "opposing" in the present specification means that faces or members are at positions in front of each other, and encompasses not only a case where they are at positions that are completely in front of each other but also case where they are at positions that are partially in front of each other. Also, the term "opposing" in the present specification encompasses both a case where a member different from two portions is interposed between the two portions and a case where nothing is interposed between the two portions.

[2] It is preferable that the wire member has a wire and a covering member covering an outer circumference of the wire, and the covering member passes through the through hole while covering the outer circumference of the wire.

According to this configuration, the wire is passed through the through hole of the electromagnetic wave absorbing member in a state of being covered by the covering member. For this reason, it is possible to suppress direct contact between the inner circumferential surface of the through hole and the outer circumferential surface of the wire. As a result, it is possible to suitably suppress damage to the wire caused by contact with the inner circumferential surface of the through hole.

[3] It is preferable that the covering member is formed in a sheet shape having a slit extending along a length direction of the wire, the covering member has a first end portion in a first direction intersecting the length direction of the wire, and a second end portion provided on a side opposite to the first end portion in the first direction, the covering member is formed so as to have a tubular shape surrounding the outer circumference of the wire over the entire circumference in a circumferential direction by overlapping the second end portion on the first end portion, and the fixing member is provided so as to surround an outer circumference of the covering member over the entire circumference in the circumferential direction.

According to this configuration, by overlapping the second end portion on the first end portion of the sheet-shaped covering member, the covering member can be formed so as to have a cylindrical shape that surrounds the outer circumference of the wire over the entire circumference in the circumferential direction. For this reason, the covering member can be easily attached to the wire later. This makes it possible to improve the assembly workability of the wire harness.

Also, by forming the fixing member so as to surround the outer circumference of the covering member over the entire circumference in the circumferential direction, the tubular state of the covering member can be maintained by the fixing member. As a result, it is possible to suppress an increase in the number of components compared to the case where the member for fixing the electromagnetic wave absorbing member to the wire member and the member for maintaining the tubular state of the covering member are separately provided.

[4] It is preferable that the fixing member is formed by winding one tape member, the fixing member includes: a first region in which the tape member is wound around the outer circumference of the wire member led out to one side from the through hole, a second region formed such that the tape member drawn outward from the first region is adhered to an outer circumferential surface of the electromagnetic wave absorbing member and extends to the wire member led out to the other side from the through hole, a third region in which the tape member is wound around the outer circumference of the wire member led out to the other side from the through hole, and a fourth region formed such that the tape member drawn outward from the third region is adhered to the outer circumferential surface of the electromagnetic wave absorbing member and extends to the first region, the tape member in the fourth region is formed so as to extend intersecting the tape member in the second region, the tape member is formed so as to cover only a portion in the circumferential direction of the outer circumferential surface of the electromagnetic wave absorbing member, and the first portion is a portion arranged at a position that is nearer to the outer circumferential surface of the electromagnetic wave absorbing member covered by the tape member than the second portion, in a direction intersecting the central axis direction.

According to this configuration, the tape member is formed so as to cover only a portion in the circumferential direction of the outer circumferential surface of the electromagnetic wave absorbing member. As a result, it is possible to reduce the length of the tape member compared to the case where, for example, the tape member is formed so as to cover the outer circumferential surface of the electromagnetic wave absorbing member over the entire circumference in the circumferential direction. As a result, the manufacturing cost of the wire harness can be reduced.

[5] It is preferable to further include a tubular electromagnetic shielding member covering the outer circumferences of the wire member and the electromagnetic wave absorbing member.

According to this configuration, the electromagnetic waves emitted from the wire member can be reduced by the electromagnetic wave absorbing member and the electromagnetic shielding member surrounding the outer circumference of the electromagnetic wave absorbing member.

[6] It is preferable that the fixing member is a tape member, the fixing member is provided between the electromagnetic wave absorbing member and the electromagnetic shielding member in a direction intersecting a central axis direction in which a central axis of the through hole extends, and the fixing member covers the outer circumferential surface of the electromagnetic wave absorbing member and covers the outer circumferential surface of the wire member.

According to this configuration, a tape member is formed so as to cover the outer circumferential surface of the electromagnetic wave absorbing member, and the tape member is provided between the electromagnetic wave absorbing member and the electromagnetic shielding member. As a result, it is possible to suppress direct contact between the electromagnetic wave absorbing member and the electromagnetic shielding member, and therefore it is possible to suitably suppress wearing of the electromagnetic shielding member caused by contact with the electromagnetic wave absorbing member. As a result, damage to the electromagnetic shielding member can be suitably suppressed. Consequently, it is possible to suppress a decrease in the electromagnetic shielding performance of the electromagnetic shielding member.

[7] It is preferable to further include: a first outer cover member that accommodates the wire member; a second outer cover member that accommodates the wire member and is provided spaced apart from the first outer cover member in the length direction of the wire member; and a protective member that covers the outer circumference of the electromagnetic wave absorbing member and is fixed so as to bridge between the outer circumference of the first outer cover member and the outer circumference of the second outer cover member, and the electromagnetic wave absorbing member is provided between the first outer cover member and the second outer cover member in the length direction of the wire member.

According to this configuration, since the outer circumference of the electromagnetic wave absorbing member is covered by the protective member, the protective member can be interposed between the electromagnetic wave absorbing member and its peripheral components. As a result, it is possible to suppress contact between the electromagnetic wave absorbing member and the peripheral components, and therefore it is possible to suppress damage to the electromagnetic wave absorbing member caused by contact between the electromagnetic wave absorbing member and the peripheral components.

[8] It is preferable that an inner circumferential surface of the protective member is in contact with an outer circumferential surface of the electromagnetic shielding member, and the inner circumferential surface of the electromagnetic shielding member is in contact with the tape member covering the outer circumferential surface of the electromagnetic wave absorbing member.

In this configuration, even if the electromagnetic shielding member is fastened toward the outer circumferential surface of the electromagnetic wave absorbing member by the protective member, the tape member is interposed between the electromagnetic wave absorbing member and the electromagnetic shielding member, and therefore it is possible to suppress direct contact between the outer circumferential surface of the electromagnetic wave absorbing member and the electromagnetic shielding member. For this reason, it is possible to suitably suppress wearing of the electromagnetic shielding member caused by contact with the electromagnetic wave absorbing member. As a result, damage to the electromagnetic shielding member can be suitably suppressed.

[9] It is preferable to further include a restricting member that covers the outer circumferential surface of the electromagnetic shielding member exposed from the first outer cover member and the second outer cover member and restricts expansion in a radial direction of the electromagnetic shielding member.

According to this configuration, the restricting member suppresses expansion in the radial direction of the electromagnetic shielding member. For this reason, workability when attaching the protective member so as to cover the outer circumference of the electromagnetic shielding member can be improved.

DETAILED DESCRIPTION OF EMBODIMENT OF THE DISCLOSURE

A specific example of a wire harness according to this disclosure will be described with reference to the drawings below. In the drawings, some of the components may be exaggerated or simplified for the sake of description. Also, the dimensional proportions of some parts may differ from their actual proportions. "Parallel" and "orthogonal" in this specification include not only strictly parallel and orthogonal but also generally parallel and orthogonal in a range in which the effects of this embodiment are achieved. Note that the present disclosure is not limited to these examples, but is indicated by the claims, and all changes that fall within the meaning and range of equivalency of the claims are intended to be embraced therein.

Overall Configuration of Wire Harness 10

A wire harness 10 shown in FIG. 1 electrically connects two or three or more electric devices (devices). The wire harness 10 electrically connects, for example, an inverter 11 installed at the front of a vehicle V such as a hybrid vehicle or an electric vehicle, and a high-voltage battery 12 installed on the rear side of the vehicle V relative to the inverter 11. The wire harness 10 is routed, for example, so as to pass under a floor of the vehicle V or the like. For example, an intermediate portion of the wire harness 10 in the length direction is routed so as to pass outside the vehicle interior, such as under the floor of the vehicle V. The inverter 11 is connected to a wheel drive motor (not shown) that is a power source for vehicle travel. The inverter 11 generates AC power from the DC power of the high-voltage battery 12, and supplies the AC power to the motor. The high-voltage battery 12 is, for example, a battery capable of supplying a voltage of several hundred volts.

The wire harness 10 includes one or a plurality of (in the present embodiment, two) wires 20, a pair of connectors C1 attached to both ends of the wires 20, an outer cover member 30 (outer cover) that collectively surrounds the plurality of wires 20, and an electromagnetic wave absorbing member 80 (electromagnetic wave absorber).

Configuration of Wires 20

One end portion of each wire 20 is connected to the inverter 11 via the connector C1, and the other end of each wire 20 is connected to the high-voltage battery 12 via the connector C1. Each wire 20 is formed in a long shape so as to extend in the front-rear direction of the vehicle V, for example. Each wire 20 is formed so as to be bent in a two-dimensional shape or a three-dimensional shape, for example, depending on the routing path of the wire harness 10. Each wire 20 is, for example, a high-voltage wire that can handle a high voltage and a large current. Each wire 20 may be, for example, a shielded wire having an electromagnetic shielding structure, or a non-shielded wire having no electromagnetic shielding structure. Each wire 20 of this embodiment is a non-shielded wire.

Figure 2:
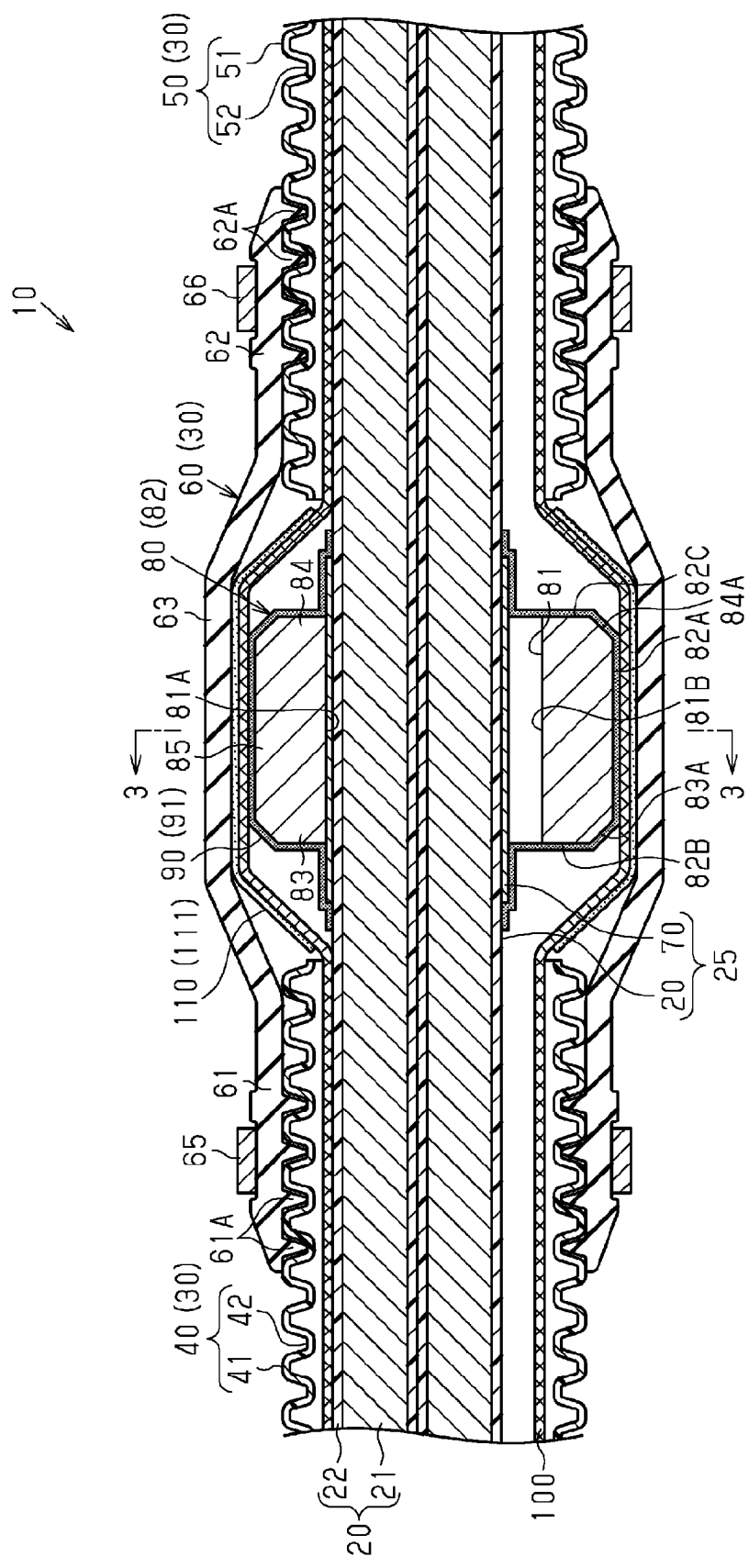
FIG. 2 is a schematic cross-sectional view showing a wire harness according to an embodiment.

As shown in FIG. 2, the wire 20 is a covered wire having a core wire 21 made of a conductor and an insulating covering 22 covering the outer circumference of the core wire 21. As the core wire 21, for example, a stranded wire formed by twisting a plurality of metal strands together, a columnar conductor made of one columnar metal rod having a solid structure inside, a tubular conductor having a hollow structure inside, or the like can be used. As the core wire 21, for example, a stranded wire, a columnar conductor, and a tubular conductor may be used in combination. Examples of the columnar conductor include a single core wire and a bus bar. The core wire 21 of the present embodiment is a stranded wire. As the material of the core wire 21, for example, a metal material such as a copper-based metal material or an aluminum-based metal material can be used.

Configuration of Core Wire 21

The cross-sectional shape (i.e., transverse cross-sectional shape) obtained by cutting the core wire 21 along a plane orthogonal to the length direction of the core wire 21 may be any shape. The transverse cross-sectional shape of each core wire 21 is a circular, semicircular, polygonal, square, or flat shape, for example. The transverse cross-sectional shape of the core wire 21 in this embodiment is a circular shape.

Configuration of Insulating Covering 22

The insulating coverings 22 respectively cover the outer circumferential surfaces of the core wires 21 over the entire circumference in the circumferential direction, for example. The insulating covering 22 is made of an insulating material such as a synthetic resin, for example. It is possible to use a synthetic resin containing polyolefin-based resin as a main component, such as crosslinked polyethylene or crosslinked polypropylene, as the material of the insulating covering 22, for example. Materials of one or more types can be used alone or in combination of two or more as the material of the insulating covering 22. The insulating covering 22 can be formed through, for example, extrusion molding (extrusion coating) performed on the core wire 21.

Configuration of Outer Cover Member 30

The outer cover member 30 shown in FIG. 1 has a long tubular shape overall. A plurality of wires 20 are accommodated in the internal space of the outer cover member 30. The outer cover member 30 is formed so as to surround the outer circumference of the plurality of wires 20 over the entire circumference in the circumferential direction, for example. The outer cover member 30 protects the wires 20 from, for example, flying objects and water droplets. As the outer cover member 30, for example, a metal or resin pipe, a resin protector, a flexible corrugated tube made of resin, a rubber waterproof cover, or a combination thereof can be used. As the material of the metal pipe, a metal material such as a copper-based metal material or an aluminum-based metal material can be used. As the material of the resin protector and the corrugated tube, for example, a resin material having conductivity or a resin material having no conductivity can be used. As the resin material, for example, a synthetic resin such as polyolefin, polyamide, polyester, and ABS resin can be used.

As shown in FIG. 2, the outer cover member 30 has, for example, a corrugated tube 40, a corrugated tube 50, and a protective member 60. As the material of the corrugated tubes 40 and 50 of the present embodiment, a resin material having no conductivity is used. As the resin material, for example, a synthetic resin such as polyolefin, polyamide, polyester, and ABS resin can be used.

Configuration of Corrugated Tube 40

The corrugated tube 40 has, for example, a tubular shape that collectively surrounds the outer circumference of the plurality of wires 20 overall. The corrugated tube 40 is provided, for example, so as to surround the outer circumference of the plurality of wires 20 over the entire circumference in the circumferential direction. The corrugated tube 40 is provided, for example, so as to surround a portion in the length direction (axial direction) of the wires 20. The corrugated tube 40 has an accordion structure in which ring-shaped protrusions 41 and ring-shaped recesses 42 are arranged alternatingly along the length direction thereof. The corrugated tube 40 is more flexible than the core wire 21. The corrugated tube 40 of the present embodiment is formed in a cylindrical shape.

Configuration of Corrugated Tube 50

The corrugated tube 50 is provided, for example, spaced apart from the corrugated tube 40 in the length direction of each wire 20. The corrugated tube 50 has, for example, a tubular shape that collectively surrounds the outer circumference of the plurality of wires 20 overall. The corrugated tube 50 is provided, for example, so as to surround the outer circumference of the plurality of wires 20 over the entire circumference in the circumferential direction. The corrugated tube 50 is provided, for example, so as to surround a portion in the length direction of the wires 20. The corrugated tube 50 has an accordion structure in which ring-shaped protrusions 51 and ring-shaped recesses 52 are arranged alternatingly along the length direction thereof. The corrugated tube 50 is more flexible than the core wire 21. The corrugated tube 50 of the present embodiment is formed in a cylindrical shape.

Configuration of Protective Member 60

The protective member 60 is provided so as to bridge between the outer circumference of the corrugated tube 40 and the outer circumference of the corrugated tube 50, for example. The protective member 60 has, for example, a tubular shape in which both ends in the length direction of the wires 20 are open. As the material of the protective member 60, for example, an elastic material having a relatively high hardness can be used. As the elastic material, for example, rubber such as ethylene propylene diene rubber or elastomer can be used.

Configuration of Wire Harness 10

The wire harness 10 has, for example, a wire member 25. The wire member 25 has, for example, a wire 20 and a covering member 70 that covers the wire 20. The wire harness 10 has, for example, an electromagnetic wave absorbing member 80 provided on a portion in the length direction of the wire member 25, and a fixing member 90 for fixing the electromagnetic wave absorbing member 80 to the wire member 25. The wire harness 10 has, for example, a braided member 100 that surrounds the wire member 25, and a regulating member 110 that covers the outer circumference of the braided member 100 and restricts expansion of the braided member 100.

Configuration of Covering Member 70

The covering member 70 is formed so as to cover, for example, the wires 20 at the portion passing through the electromagnetic wave absorbing member 80. The covering member 70 is provided so as to surround the outer circumference of the wires 20 located between the corrugated tube 40 and the corrugated tube 50, for example. The covering member 70 is provided, for example, so as to surround the wires 20 exposed from both of the corrugated tubes 40 and 50. The covering member 70 has, for example, a tubular shape that collectively surrounds the outer circumference of the plurality of wires 20 overall. The covering member 70 is provided, for example, so as to surround the outer circumference of the plurality of wires 20 over the entire circumference in the circumferential direction. The covering member 70 is exposed from both of the corrugated tubes 40 and 50, for example. Note that, for example, one end portion in the length direction of the covering member 70 may be accommodated in the internal space of the corrugated tube 40 and the other end in the length direction may be accommodated in the internal space of the corrugated tube 50. The outer circumferential dimension of the covering member 70 is set to be smaller than the inner circumferential dimension of the corrugated tubes 40 and 50, for example.

Figure 3:
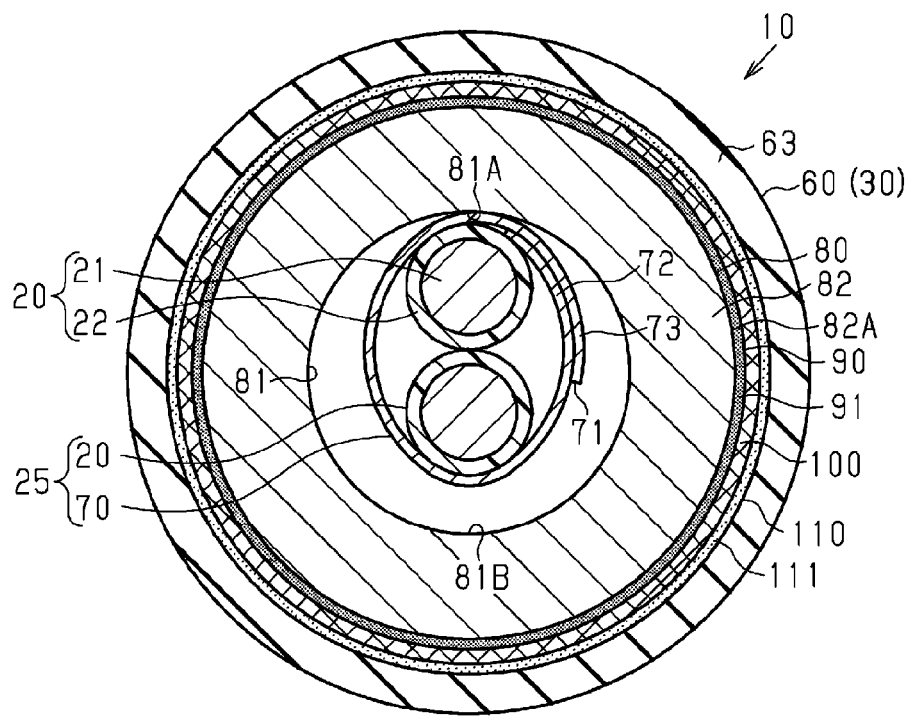
FIG. 3 is a schematic cross-sectional view (a cross-sectional view taken along line 3-3 in FIG. 2) showing a wire harness according to an embodiment.

As shown in FIG. 3, for example, the covering member 70 is formed in a sheet shape having a slit 71 extending along the length direction of the wires 20. The covering member 70 is formed so as to have a tubular shape, for example, by winding a flexible resin sheet in the circumferential direction of the wires 20. The covering member 70 includes, for example, an end portion 72 in a first direction (in FIG. 3, the circumferential direction of the wires 20) intersecting the length direction of the wires 20, and an end portion 73 on the opposite side in the first direction from the end portion 72. The covering member 70 is formed so as to have a tubular shape by, for example, overlapping the end portion 72 and the end portion 73 in the radial direction of the wires 20. The inner circumferential dimension of the covering member 70 can be adjusted to match the outer circumferential dimension of the plurality of wires 20 by, for example, adjusting the overlapping width of the end portion 72 and the end portion 73. The covering member 70 has elasticity according to which it is possible to return from a tubular state of being able to surround the outer circumference of the wires 20 to a sheet state of not surrounding the outer circumference of the wires 20, for example.

As the material of the covering member 70, a resin material having no conductivity is used. As the resin material, for example, synthetic resins such as polyethylene terephthalate, polyolefin, polyamide, polyester, and ABS resin can be used. As the covering member 70, for example, a twist tube can be used. The twist tube is made of, for example, a woven fabric made of polyethylene terephthalate or polyester. The twist tube is formed by, for example, weaving resin fibers, and has a mesh.

Configuration of Electromagnetic Wave Absorbing Member 80

As shown in FIG. 2, the electromagnetic wave absorbing member 80 is provided on the outer circumference of the wires 20 located between the corrugated tube 40 and the corrugated tube 50, for example. For example, the corrugated tube 40 is provided on one side of the electromagnetic wave absorbing member 80, and the corrugated tube 50 is provided on the other side of the electromagnetic wave absorbing member 80 in the length direction of the wires 20. The electromagnetic wave absorbing member 80 is provided spaced apart from the corrugated tube 40 in the length direction of the wires 20, for example. The electromagnetic wave absorbing member 80 is provided spaced apart from the corrugated tube 50 in the length direction of the wires 20, for example. The electromagnetic wave absorbing member 80 is, for example, exposed from the corrugated tubes 40 and 50. The electromagnetic wave absorbing member 80 is provided, for example, so as to collectively surround the outer circumference of the plurality of wires 20. The electromagnetic wave absorbing member 80 is provided, for example, so as to surround the outer circumference of the covering member 70 over the entire circumference in the circumferential direction. The electromagnetic wave absorbing member 80 absorbs some of the electromagnetic waves (electromagnetic noise) emitted from the wire 20, for example.

The electromagnetic wave absorbing member 80 has, for example, a through hole 81 through which the plurality of wires 20 collectively pass. The electromagnetic wave absorbing member 80 has a ring shape, for example, due to having the through hole 81. For example, the electromagnetic wave absorbing member 80 is formed in a ring shape that has the through hole 81 in a plan view from the length direction of the wires 20, and has a predetermined length by which it extends along a central axis direction in which the central axis passing through the center of the through hole 81 extends. In the present embodiment, the central axis direction of the electromagnetic wave absorbing member 80 is set to a direction of extending parallel to the length direction of the wire 20. Note that in the following description, when the term "central axis direction" is simply described, it is assumed to mean the central axis direction of the electromagnetic wave absorbing member 80.

The through hole 81 is formed so as to pass through the electromagnetic wave absorbing member 80 in the length direction of the wires 20, for example. The plurality of wires 20 are provided so as to pass through the through hole 81, for example. The covering member 70 is provided so as to pass through the through hole 81 in a state of collectively surrounding the outer circumference of the plurality of wires 20, for example. The inner circumferential surface of the through hole 81 opposes the outer circumferential surface of the wire member 25.

The electromagnetic wave absorbing member 80 of the present embodiment is constituted by only a ring-shaped magnetic core 82. The magnetic core 82 of the present embodiment is formed in a circular ring shape. The magnetic core 82 has, for example, a function of reducing electromagnetic waves emitted from the wire 20 due to being arranged so as to oppose the wires 20 over the entire circumference in the circumferential direction of the wires 20. For example, the magnetic core 82 absorbs electromagnetic waves emitted from the wires 20 and converts the energy of the electromagnetic waves into mechanical energy such as vibration or thermal energy. As a result, the adverse effect of the electromagnetic waves emitted from the wires 20 on peripheral devices and the like is reduced.

The magnetic core 82 is, for example, a molded body containing a soft magnetic material. Examples of the soft magnetic material include iron (Fe), iron alloys and ferrites. Examples of the iron alloys include a Fe-silicon (Si) alloy and a Fe-nickel (Ni) alloy. As the magnetic core 82, for example, a ferrite core, an amorphous core, or a permalloy core can be used. The ferrite core is made of, for example, soft ferrite exhibiting soft magnetism. Examples of the soft ferrite include a ferrite containing nickel (Ni) and zinc (Zn) and a ferrite containing manganese (Mn) and zinc (Zn). The material of the magnetic core 82 can be appropriately selected, for example, according to the frequency band of the electromagnetic noise to be reduced.

As shown in FIG. 3, the magnetic core 82 of the present embodiment is formed continuously over the entire circumference in the circumferential direction, and is formed in an endless structure. That is, the magnetic core 82 of the present embodiment is formed in a structure in which the entirety is connected to form a continuous ring, that is, an endless structure in which the start point and the end point coincide with each other. In other words, a slit extending along the central axis direction of the magnetic core 82 is not formed in the magnetic core 82 of the present embodiment. The magnetic core 82 of this embodiment is constituted by one component. Note that in the present embodiment, the magnetic core 82 was constituted by one component, but a plurality of core materials may be combined to form a ring-shaped magnetic core 82. For example, the magnetic core 82 may be formed into a cylindrical shape by combining a pair of core materials having a semicircular transverse cross section.

As shown in FIG. 2, the magnetic core 82 includes, for example, an end portion 83 in the central axis direction of the electromagnetic wave absorbing member 80, an end portion 84 on the side opposite to the end portion 83 in the central axis direction, and a central portion 85 provided between the end portion 83 and the end portion 84. The end portion 83 is the end portion provided on the corrugated tube 40 side out of the two end portions in the central axis direction of the magnetic core 82. The end portion 84 is the end portion provided on the corrugated tube 50 side out of the two end portions in the central axis direction of the magnetic core 82. The magnetic core 82 has, for example, an outer circumferential surface 82A extending along the circumferential direction of the magnetic core 82, a side surface 82B that extends along the radial direction of the magnetic core 82 and faces the corrugated tube 40 side, and a side surface 82C that extends along the radial direction of the magnetic core 82 and faces the corrugated tube 50 side. The side surface 82B constitutes an end surface in the central axis direction of the end portion 83. The side surface 82C constitutes an end surface in the central axis direction of the end portion 84. The side surfaces 82B and 82C are provided, for example, between the outer circumferential surface 82A and the inner circumferential surface of the through hole 81. The outer circumferential dimension of the magnetic core 82 is set to be larger than the outer circumferential dimension of the corrugated tubes 40 and 50, for example. For this reason, the outer circumferential surface 82A of the magnetic core 82 is provided at a position protruding outward in the radial direction relative to the outer circumferential surfaces of the corrugated tubes 40 and 50.

The end portion 83 of the magnetic core 82 is formed such that the outer shape becomes smaller, for example, from the central portion 85 side toward the side surface 82B, which is the end surface in the central axis direction of the end portion 83. The outer circumferential surface of the end portion 83 has, for example, a tapered portion 83A whose outer diameter decreases from the central portion 85 side toward the side surface 82B. The outer circumferential surface of the tapered portion 83A is formed in an inclined manner so as to approach the inner circumferential surface of the through hole 81 from the central portion 85 side to the side surface 82B, for example. The tapered portion 83A is provided, for example, on at least a portion of the outer circumferential surface of the end portion 83.

The end portion 84 of the magnetic core 82 is formed, for example, such that the outer shape becomes smaller from the central portion 85 side toward the side surface 82C, which is the end surface in the central axis direction of the end portion 84. The outer circumferential surface of the end portion 84 has, for example, a tapered portion 84A whose outer diameter decreases toward the side surface 82C from the central portion 85 side. The outer circumferential surface of the tapered portion 84A is formed in an inclined manner so as to approach the inner circumferential surface of the through hole 81 from the central portion 85 side toward the side surface 82C, for example. The tapered portion 84A is provided, for example, on at least a portion of the outer circumferential surface of the end portion 84.

Configuration of Fixing Member 90

The fixing member 90 is provided so as to fix the electromagnetic wave absorbing member 80 to the wire member 25, for example. The fixing member 90 is provided so as to fix the electromagnetic wave absorbing member 80 to the covering member 70, for example. The fixing member 90 has, for example, a function of restricting the relative movement of the electromagnetic wave absorbing member 80 with respect to the wire member 25 in the length direction of the wire member 25. The fixing member 90 is provided between the electromagnetic wave absorbing member 80 and the braided member 100, for example, in a direction intersecting the length direction of the wire 20, that is, in the radial direction of the wire 20.

The fixing member 90 is formed by, for example, winding a tape member 91 around the electromagnetic wave absorbing member 80 and the wire member 25. The fixing member 90 is formed by, for example, winding one tape member 91 around the electromagnetic wave absorbing member 80, the covering member 70, and the wires 20. The tape member 91 has, for example, a pressure-sensitive adhesive layer on one surface. The tape member 91 is wound around the electromagnetic wave absorbing member 80, the covering member 70, and the wires 20 with the pressure-sensitive adhesive layer facing inward in the radial direction, for example. The tape member 91 is wound over, for example, the outer circumferential surface 82A of the electromagnetic wave absorbing member 80, the outer circumferential surface of the covering member 70, and the outer circumferential surface of the wires 20.

For example, the tape member 91 is continuously wound over a range from the outer circumferential surface 82A of the magnetic core 82 to the outer circumferential surface of the wires 20 via the outer circumferential surface of the covering member 70. Although not shown in the drawings, the tape member 91 has, for example, an overlap winding structure. Here, the overlap winding structure is a structure in which the tape member 91 is spirally wound such that predetermined portions in the width direction of the tape member 91 overlap each other. Note that the width direction of the tape member 91 is a direction extending along the length direction of the wires 20. As the overlap winding structure, for example, a half-wrap winding structure is preferable. Here, the half-wrap winding structure is a structure in which the tape member 91 is spirally wound so that portions that are approximately halfway in the width direction of the tape member 91 overlap each other.

The tape member 91, for example, covers the outer circumferential surface 82A of the electromagnetic wave absorbing member 80 so as to fasten it inward in the radial direction. The tape member 91, for example, covers the outer circumferential surface 82A of the electromagnetic wave absorbing member 80 over the entire circumference in the circumferential direction. The electromagnetic wave absorbing member 80 is fixed to the covering member 70 by being fastened radially inward by, for example, the tape member 91. The tape member 91 covers, for example, the outer circumferential surfaces of the tapered portions 83A and 84A of the electromagnetic wave absorbing member 80.

The tape member 91, for example, covers the outer circumferential surface of the covering member 70 such that the outer circumferential surface is fastened inward in the radial direction. The tape member 91 covers, for example, the outer circumferential surface of the covering member 70 such that the outer circumferential surface is fastened in the direction in which the covering member 70 approaches the wires 20. The covering member 70 is in contact with the outer circumferential surface of the wires 20, for example, due to being fastened inward in the radial direction by the tape member 91. The tape member 91, for example, covers the outer circumferential surface of the covering member 70 over the entire circumference in the circumferential direction. The tape member 91 has, for example, a function of maintaining the covering member 70 in a tubular state, that is, a function of suppressing the return of the covering member 70 to the sheet state.

The tape member 91, for example, covers the outer circumferential surface of the wires 20 such that they are fastened inward in the radial direction. The tape member 91, for example, covers the outer circumferential surface of the wires 20 so as to fasten the plurality of wires 20 in the direction in which the plurality of wires 20 approach each other. The tape member 91, for example, covers the outer circumferential surface of the plurality of wires 20 over the entire circumference in the circumferential direction.

As shown in FIG. 3, the tape member 91 is wound around the outer circumferential surfaces of the electromagnetic wave absorbing member 80 and the wire member 25 such that, for example, inside the through hole 81 of the electromagnetic wave absorbing member 80, the wire member 25 is arranged offset to a portion in the circumferential direction of the through hole 81. When the electromagnetic wave absorbing member 80 is viewed along the central axis of the through hole 81 (e.g., FIG. 3), the inner circumferential surface of the through hole 81 has a first portion 81A and a second portion 81B that is arranged at a position that is point-symmetrical to the first portion 81A with respect to the central axis of the through hole 81. At this time, the wire member 25 is in contact with the first portion 81A and is separated from the second portion 81B inside the through hole 81. For example, a portion of the covering member 70 is in contact with the first portion 81A and is separated from the second portion 81B inside the through hole 81. The tape member 91 fixes the electromagnetic wave absorbing member 80 to the outer circumference of the wire member 25 such that, for example, the wire member 25 is in contact with the first portion 81A and is separated from the second portion 81B. In other words, the electromagnetic wave absorbing member 80 is fixed to the outer circumferential surface of the wire member 25 (here, the outer circumferential surface of the covering member 70) by the tape member 91 in a state where the wire member 25 is in contact with the first portion 81A and is offset toward the first portion 81A inside the through hole 81. The plurality of wires 20 are provided side by side on a straight line connecting the first portion 81A and the second portion 81B, for example, inside the through hole 81.

Figure 4:
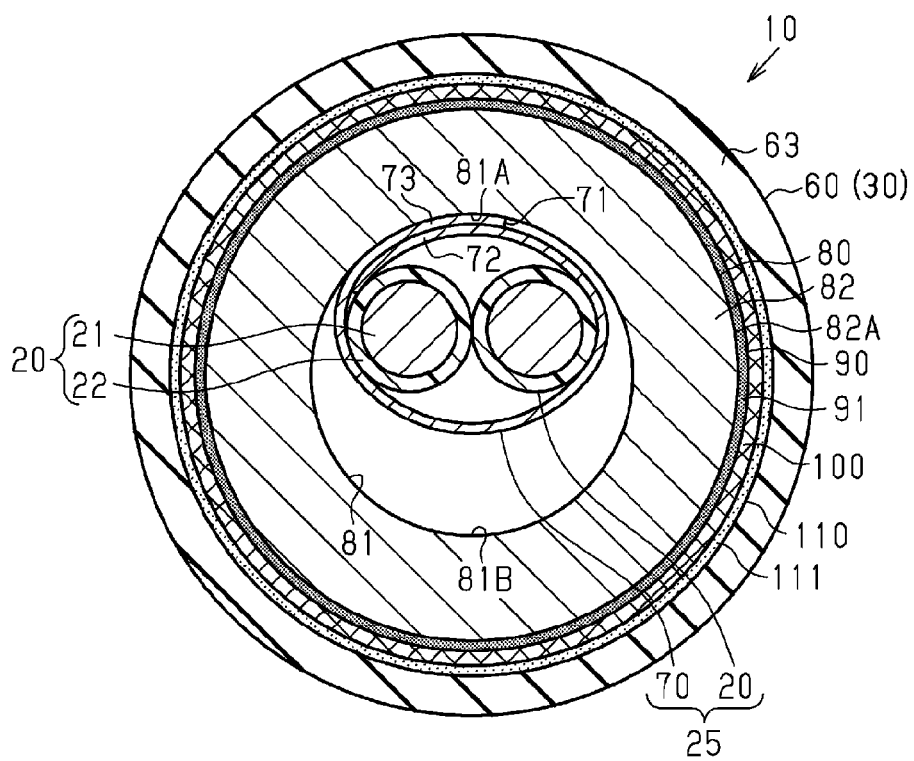
FIG. 4 is a schematic transverse cross-sectional view showing a wire harness according to a modified example.

Note that, as shown in FIG. 4, the plurality of wires 20 may be provided so as to be side by side in a direction (here, the left-right direction in the drawing) intersecting the straight line connecting the first portion 81A and the second portion 81B inside the through hole 81.

As shown in FIG. 2, for example, the wire member 25 is arranged in the same direction over the entire length in the central axis direction of the through hole 81, that is, offset to the first portion 81A side (here, the upper side in the drawing). In other words, the tape member 91 is wound around the outer circumferential surfaces of the electromagnetic wave absorbing member 80 and the wire member 25 such that the wire member 25 is arranged offset in the same direction over the entire length in the central axis direction of the through hole 81.

Configuration of Braided Member 100

The braided member 100 has, for example, a tubular shape that collectively surrounds the outer circumference of the plurality of wires 20 overall. The braided member 100 is provided, for example, so as to surround the outer circumference of the wire 20 over approximately the entire length in the length direction of the wires 20. The braided member 100 is formed, for example, so as to collectively surround the outer circumference of the plurality of wires 20 in each of the internal spaces of the corrugated tubes 40 and 50. In other words, the corrugated tubes 40 and 50 are provided so as to respectively surround the outer circumference of the wires 20 and the braided member 100. The braided member 100 is formed, for example, so as to surround the outer circumference of the electromagnetic wave absorbing member 80 between the corrugated tube 40 and the corrugated tube 50. The braided member 100 is formed such that, for example, the outer shape of the portion covering the electromagnetic wave absorbing member 80 is larger than the outer shape of other portions. The braided member 100 is provided, for example, so as to surround the outer circumference of the wire member 25, the electromagnetic wave absorbing member 80, and the fixing member 90 in the internal space of the protective member 60.

As the braided member 100, a braided member in which a plurality of metal strands are braided or a braided member in which metal strands and resin strands are braided in combination with each other can be used. As the material of the metal strands, for example, a metal material such as a copper-based metal material or an aluminum-based metal material can be used. As the resin strands, for example, reinforcing fibers having excellent insulating properties and shear resistance, such as para-aramid fibers, can be used. Note that both end portions of the braided member 100 are connected to ground (grounded) at, for example, a connector C1 (see FIG. 1), although this is not shown in the drawings.

Configuration of Restricting Member 110

The restricting member 110 is formed, for example, so as to cover the outer circumferential surface of the braided member 100. The regulating member 110 is formed, for example, so as to cover the outer circumferential surface of the braided member 100 exposed from the corrugated tubes 40 and 50. The restricting member 110 has, for example, a function of suppressing the braided member 100 from expanding in the radial direction and the circumferential direction. The restricting member 110 is provided between the braided member 100 and the protective member 60, for example, in a direction intersecting the length direction of the wire 20, that is, in the radial direction of the wires 20.

The restricting member 110 is formed, for example, by winding the tape member 111 around the outer circumferential surface of the braided member 100. In the restricting member 110, for example, one tape member 111 is wound around the outer circumferential surface of the braided member 100 exposed from both of the corrugated tubes 40 and 50. The tape member 111 has, for example, a pressure-sensitive adhesive layer on one surface. The tape member 111 is wound around the outer circumferential surface of the braided member 100, for example, with the pressure-sensitive adhesive layer facing inward in the radial direction. The tape member 111, for example, covers the outer circumferential surface of the braided member 100 so as to fasten it inward in the radial direction. The tape member 111 covers, for example, the outer circumferential surface of the braided member 100 so as to fasten it in the direction in which the braided member 100 approaches the electromagnetic wave absorbing member 80 and the fixing member 90. The tape member 111 covers, for example, the outer circumferential surface of the braided member 100 over the entire circumference in the circumferential direction.

The tape member 111 is wound around the outer circumferential surface of the braided member 100 so as to extend along the length direction of the wire member 25, for example, between the corrugated tube 40 and the corrugated tube 50. Although not shown in the drawings, the tape member 111 has, for example, an overlap winding structure.

Configuration of Protective Member 60

The protective member 60 is provided, for example, so as to surround the outer circumference of the electromagnetic wave absorbing member 80. The protective member 60 functions as, for example, a waterproof cover for waterproofing various members arranged inside of the protective member 60.

The protective member 60 includes, for example, a tubular connection tube portion 61 connected to the outer circumference of the corrugated tube 40, a tubular connection tube portion 62 connected to the outer circumference of the corrugated tube 50, and a main body tube portion 63 that is provided between the connection tube portion 61 and the connection tube portion 62. The main body tube portion 63 is formed protruding radially outward from the outer circumference of the other portions, that is, the connection tube portions 61 and 62. The main body tube portion 63 is formed, for example, so as to protrude radially outward from the connection tube portions 61 and 62 over the entire circumference in the circumferential direction of the connection tube portions 61 and 62. The outer circumferential dimension of the main body tube portion 63 is formed to be larger than the outer circumferential dimension of the connection tube portions 61 and 62, for example. For example, the outer radius of the main body tube portion 63 is formed to be larger than the outer radius of the connection tube portions 61 and 62. The protective member 60 is, for example, a single component formed in one piece by connecting the connection tube portion 61, the main body tube portion 63, and the connection tube portion 62. The connection tube portions 61 and 62 and the main body tube portion 63 of the present embodiment are formed continuously over the entire circumference in the circumferential direction, and are formed in an endless structure in which the start point and the end point coincide with each other. In other words, no slits extending along the length direction of the wires 20 are formed in the connection tube portions 61 and 62 and the main body tube portion 63 of the present embodiment.

In the protective member 60, for example, the connection tube portion 61 is fitted to the outer circumference of the corrugated tube 40, and the connection tube portion 62 is fitted to the outer circumference of the corrugated tube 50.

The connection tube portion 61 is formed in a tubular shape having a size according to which it can be fitted on the outer circumference of the corrugated tube 40, for example. The connection tube portion 61 of the present embodiment is formed in a cylindrical shape. On the inner circumferential surface of the end portion of the connection tube portion 61, for example, one or a plurality of (here, four) lips 61A that engage with the corrugated tube 40 are formed. Each lip 61A is, for example, formed continuously over the entire circumference of the inner circumferential surface of the connection tube portion 61, and is formed in an endless structure. Each lip 61A is formed, for example, so as to enter a ring-shaped recess 42 of the corrugated tube 40 when the connection tube portion 61 is fitted to the outer circumference of the corrugated tube 40.

For example, a coupling member 65 is provided on the outer circumferential surface of the connection tube portion 61. As the coupling member 65, for example, a cable tie made of resin or metal, a caulking ring, a tape member, or the like can be used. The connection tube portion 61 is fastened from the outer circumferential side by the coupling member 65 and fixed to the corrugated tube 40. For example, the connection tube portion 61 is fastened from the outer circumferential side by the coupling member 65 until it is in close contact with the corrugated tube 40 in a liquid-tight manner. As a result, it is possible to suppress a case in which water enters the inside of the protective member 60 from between the connection tube portion 61 and the corrugated tube 40.

The connection tube portion 62 is formed in, for example, a tubular shape having a size that can be fitted to the outer circumference of the corrugated tube 50. The connection tube portion 62 of the present embodiment is formed in a cylindrical shape. On the inner circumferential surface of the end of the connection tube portion 62, for example, one or more (here, four) lips 62A that engage with the corrugated tube 50 are formed. Each lip 62A is formed continuously over the entire circumference of the inner circumferential surface of the connection tube portion 62, for example, and is formed in an endless structure. Each lip 62A is formed, for example, so as to enter a ring-shaped recess 52 of the corrugated tube 50 when the connection tube portion 62 is fitted to the outer circumference of the corrugated tube 50.

For example, a coupling member 66 is provided on the outer circumferential surface of the connection tube portion 62. As the coupling member 66, for example, a cable tie made of resin or metal, a caulking ring, a tape member, or the like can be used. The connection tube portion 62 is fastened from the outer circumferential side by the coupling member 66 and is fixed to the corrugated tube 50. For example, the connection tube portion 62 is fastened from the outer circumferential side by the coupling member 66 until it is in close contact with the corrugated tube 50 in a liquid-tight manner. As a result, it is possible to suppress a case in which water enters the inside of the protective member 60 from between the connection tube portion 62 and the corrugated tube 50.

For example, one end portion of the main body cylinder 63 is formed continuously in one piece with the connection tube portion 61, and the other end portion is formed continuously in one piece with the connection tube portion 62. The main body tube portion 63 is formed in a tubular shape having a size capable of accommodating, for example, the electromagnetic wave absorbing member 80.

The main body tube portion 63 of the present embodiment is formed in a cylindrical shape. The main body tube portion 63 is formed so as to surround the outer circumference of the electromagnetic wave absorbing member 80 over the entire circumference in the circumferential direction. The main body tube portion 63 is formed so as to surround, for example, the wires 20, the covering member 70, the electromagnetic wave absorbing member 80, the fixing member 90, the braided member 100, and the restricting member 110 exposed from both of the corrugated tubes 40 and 50 over the entire circumference in the circumferential direction.

The inner circumferential surface of the main body cylinder portion 63 is in contact with, for example, the outer circumferential surface of the restricting member 110. The inner circumferential surface of the restricting member 110 is in contact with, for example, the outer circumferential surface of the braided member 100. The inner circumferential surface of the braided member 100 is in contact with, for example, the outer circumferential surface of the fixing member 90. For example, the inner circumferential surface of the braided member 100 is in contact with the outer circumferential surface of the fixing member 90 that covers the outer circumferential surface 82A of the magnetic core 82. For example, the inner circumferential surface of the braided member 100 is in contact with the outer circumferential surface of the fixing member 90 that covers the outer circumferential surfaces of the tapered portions 83A and 84A of the magnetic core 82.

Method for Manufacturing Wire Harness 10

Next, a method for manufacturing the wire harness 10 will be described.

Figure 5:
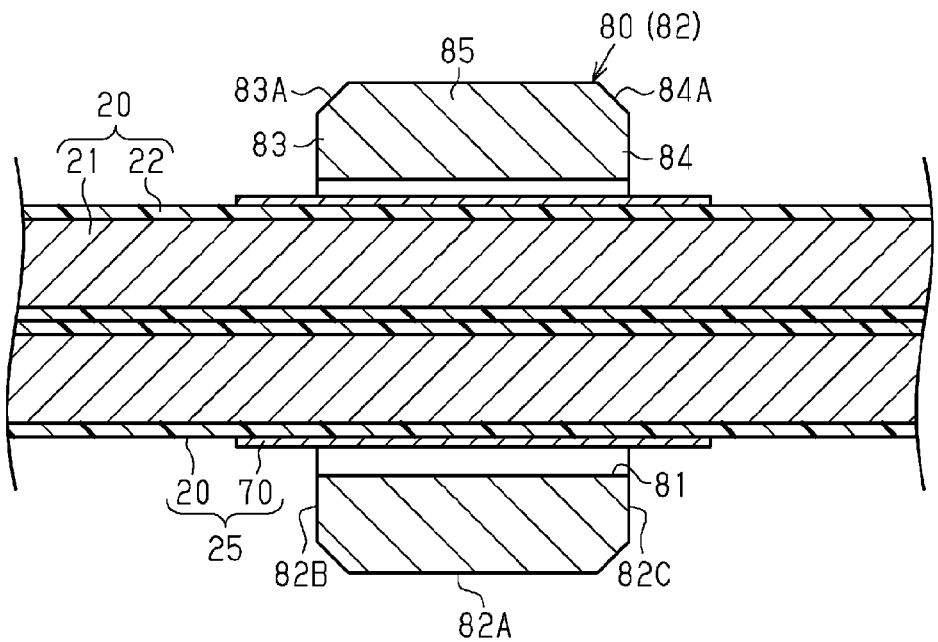
FIG. 5 is a schematic cross-sectional view showing a method for manufacturing a wire harness according to an embodiment.

In the step shown in FIG. 5, the sheet-shaped covering member 70 is wound in the circumferential direction of the wires 20 to form a tubular covering member 70 that collectively surrounds the outer circumference of the plurality of wires 20. As a result, the wire member 25 having the wires 20 and the covering member 70 is formed. Next, the covering member 70 surrounding the outer circumference of the plurality of wires 20 is passed through the through hole 81 of the magnetic core 82. At this time, since the end portion 72 and the end portion 73 of the covering member 70 shown in FIG. 3 are not adhered to each other, the covering member 70 tries to return to the sheet state. However, since the covering member 70 is passed through the through hole 81 in a cylindrical state, the covering member 70 comes into contact with the inner circumferential surface of the through hole 81 when the covering member 70 tries to return to the sheet state. As a result, it is possible to suppress a case in which the covering member 70 returns to the sheet state, and it is possible to keep the covering member 70 in the tubular state. Also, the wire member 25 in this step is not arranged offset to one side, for example, inside the through hole 81.

Figure 6:
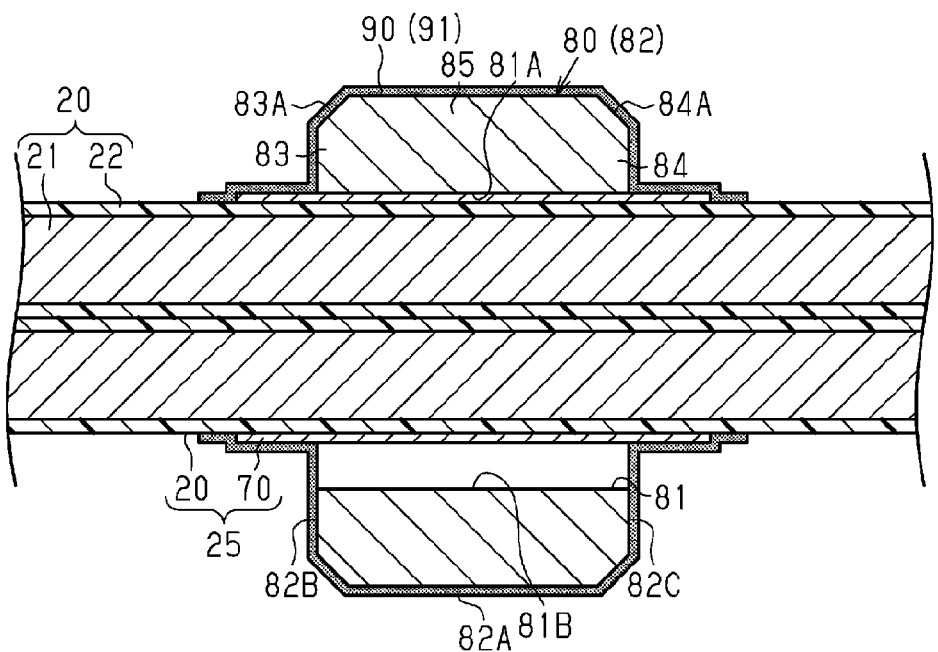
FIG. 6 is a schematic cross-sectional view showing a method for manufacturing a wire harness according to an embodiment.

Next, in the step shown in FIG. 6, the tape member 91 is wound around the range from the outer circumferential surface 82A of the magnetic core 82 to the outer circumferential surface of the wires 20. The tape member 91 is wound multiple times around the magnetic core 82, the covering member 70, and the wire 20 over the entire circumference in the circumferential direction, for example, using a half-wrap winding structure. At this time, the tape member 91 is wound around the outer circumferential surfaces of the electromagnetic wave absorbing member 80 and the wire member 25 such that the wire member 25 is in contact with the first portion 81A and is separated from the second portion 81B inside the through hole 81, for example. Through this step, the electromagnetic wave absorbing member 80 is fixed to the wire member 25 by the tape member 91. As a result, it is possible to restrict the movement of the electromagnetic wave absorbing member 80 in the length direction of the wire member 25. Also, the covering member 70 is kept in a tubular state by winding the tape member 91 around the covering member 70.

Figure 7:
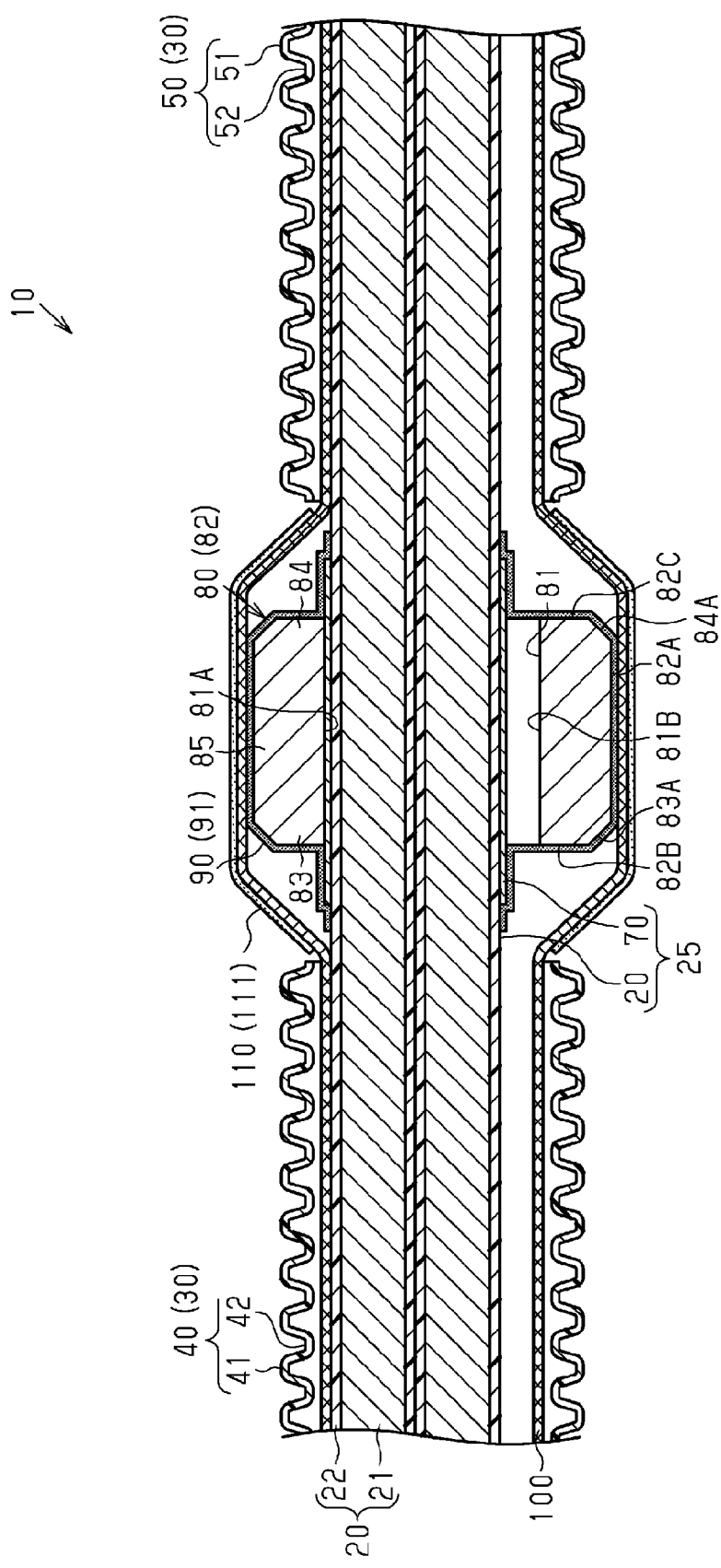
FIG. 7 is a schematic cross-sectional view showing a method for manufacturing a wire harness according to an embodiment.

Next, in the step shown in FIG. 7, the braided member 100 that surrounds the outer circumference of the wire member 25 and surrounds the outer circumference of the electromagnetic wave absorbing member 80 is provided. The braided member 100 is formed such that, for example, the outer diameter of the portion covering the electromagnetic wave absorbing member 80 is larger than the outer diameter of the other portions.

Next, the corrugated tubes 40 and 50 that surround the outer circumference of the wire member 25 and are located on both sides of the electromagnetic wave absorbing member 80 in the length direction of the wire member 25 are provided. The corrugated tubes 40 and 50 are provided, for example, so as to surround the outer circumference of the braided member 100 that collectively surrounds the plurality of wires 20.

Next, the outer circumference of the braided member 100 exposed from both of the corrugated tubes 40 and 50 is covered by the tape member 111 of the restricting member 110. The tape member 111 fastens the braided member 100 inward in the radial direction. As a result, it is possible to suppress a case in which the braided member 100 expands in the circumferential direction and the radial direction. Also, the braided member 100 is fastened by the tape member 111 in the direction of approaching the electromagnetic wave absorbing member 80 and the fixing member 90, whereby the inner circumferential surface of the braided member 100 is brought into contact with the outer circumferential surface of the fixing member 90 covering the outer circumferential surface 82A of the magnetic core 82.

Thereafter, as shown in FIG. 2, the protective member 60 is attached so as to surround the outer circumference of the restricting member 110. The protective member 60 is provided so as to bridge between the outer circumference of the corrugated tube 40 and the outer circumference of the corrugated tube 50, and is provided so as to surround the outer circumference of the electromagnetic wave absorbing member 80. At this time, since the restricting member 110 restricts the braided member 100 from expanding in the radial direction and the circumferential direction, it is possible to prevent the braided member 100 from lowering the attachability of the protective member 60. In other words, by covering the outer circumference of the braided member 100 with the restricting member 110, the attachability of the protective member 60 can be improved.

Next, the actions and effects of this embodiment will be described.

(1) The wire harness 10 includes the wire member 25, the ring-shaped electromagnetic wave absorbing member 80 having the through hole 81 through which the wire member 25 passes, and the fixing member 90 for fixing the electromagnetic wave absorbing member 80 to the wire member 25. When the electromagnetic wave absorbing member 80 is viewed along the central axis of the through hole 81, the inner circumferential surface of the through hole 81 has the first portion 81A and the second portion 81B that is arranged at a position point-symmetrical to the first portion 81A with respect to the central axis of the through hole 81. The fixing member 90 fixes the electromagnetic wave absorbing member 80 to the wire member 25 such that the wire member 25 comes into contact with the first portion 81A and is separated from the second portion 81B.

According to this configuration, inside the through hole 81 of the electromagnetic wave absorbing member 80, the electromagnetic wave absorbing member 80 and the wire member 25 are fixed to each other (integrated with each other) with the wire member 25 arranged in contact with the first portion 81A and offset to the first portion 81A side. For this reason, even if the electromagnetic wave absorbing member 80 vibrates accompanying traveling of the vehicle or the like, it is possible to suppress shaking of the wire member 25 in the through hole 81 caused by the vibration of the electromagnetic wave absorbing member 80. It is possible to suppress movement of the wire member 25 in the through hole 81 caused by vibration of the electromagnetic wave absorbing member 80 compared to the case where, for example, the electromagnetic wave absorbing member 80 and the wire member 25 are fixed in a state where the wire member 25 does not contact the inner circumferential surface of the through hole 81. As a result, it is possible to suppress wearing of the wire member 25 caused by contact with the inner circumferential surface of the through hole 81, and it is possible to suitably suppress damage to the wire member 25 caused by vibration of the electromagnetic wave absorbing member 80. Also, since it is possible to suppress shaking of the wire member 25 in the through hole 81, it is possible to suppress generation of abnormal noise between the electromagnetic wave absorbing member 80 and the wire member 25.

(2) The wires 20 are passed through the through hole 81 of the electromagnetic wave absorbing member 80 in a state of being covered by the covering member 70. For this reason, it is possible to suppress direct contact between the inner circumferential surface of the through hole 81 and the outer circumferential surface of the wires 20. As a result, damage to the wire 20 due to contact with the inner circumferential surface of the through hole 81 can be suitably suppressed.

(3) By overlaying the end portion 73 on the end portion 72 of the sheet-shaped covering member 70, the covering member 70 was formed so as to have a tubular shape that surrounds the outer circumference of the wires 20 over the entire circumference in the circumferential direction. For this reason, the covering member 70 can be easily attached to the wires 20 later. As a result, the assembly workability of the wire harness 10 can be improved.

(4) The fixing member 90 was formed so as to surround the outer circumference of the covering member 70 over the entire circumference in the circumferential direction. The fixing member 90 can maintain the tubular state of the covering member 70. As a result, it is possible to suppress an increase in the number of components compared to the case where the member for fixing the electromagnetic wave absorbing member 80 to the wire member 25 and the member for maintaining the tubular state of the covering member 70 are provided separately from each other.

(5) The tape member 91 is formed so as to cover the outer circumferential surface of the electromagnetic wave absorbing member 80, and the tape member 91 is provided between the electromagnetic wave absorbing member 80 and the braided member 100. As a result, it is possible to suppress a case in which the electromagnetic wave absorbing member 80 comes into direct contact with the braided member 100, and therefore it is possible to suitably suppress wearing of the braided member 100 caused by contact with the electromagnetic wave absorbing member 80. As a result, damage to the braided member 100 can be suitably suppressed. As a result, it is possible to suppress the deterioration of the electromagnetic shielding performance by the braided member 100.

(6) The protective member 60 covering the outer circumference of the electromagnetic wave absorbing member 80 was provided. For this reason, the protective member 60 can be interposed between the electromagnetic wave absorbing member 80 and its peripheral components. As a result, it is possible to suppress direct contact between the electromagnetic wave absorbing member 80 and its peripheral components, and therefore it is possible to suppress damage to the electromagnetic wave absorbing member 80 caused by contact between the electromagnetic wave absorbing member 80 and its peripheral components.

Other Embodiments

The above-described embodiment can be implemented with the following modifications. The above-described embodiment and the following modified examples can be implemented in combination with each other as long as there are no technical contradictions.

In the above-described embodiment, the protective member 60 was embodied in an endless structure, but there is no limitation to this. That is, in the above-described embodiment, the protective member 60 was embodied as already being formed as a cylinder from the state before the electromagnetic wave absorbing member 80 is arranged inside, but there is no limitation to this.

Figure 8:
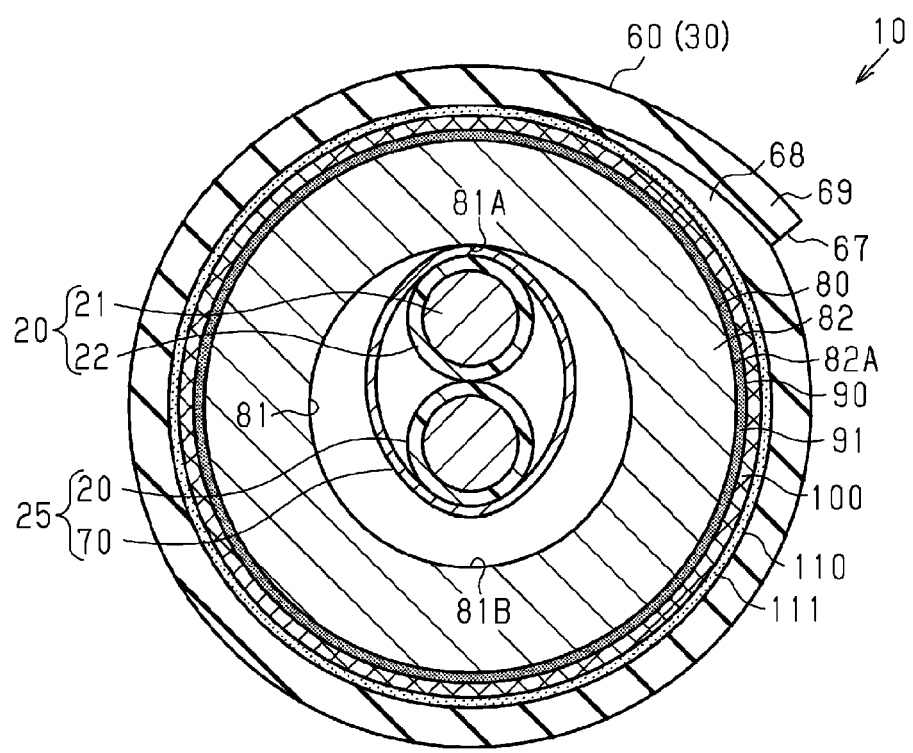
FIG. 8 is a schematic cross-sectional view showing a wire harness according to a modified example.

For example, as shown in FIG. 8, the protective member 60 may be embodied in a sheet-shaped structure having a slit 67 extending along the length direction of the wires 20. The protective member 60 of this modified example is formed so as to have a tubular shape, for example, by winding a single flexible sheet in the circumferential direction. The protective member 60 has, for example, an end portion 68 in a first direction (in FIG. 8, the circumferential direction of the wire 20) intersecting the length direction of the wires 20, and an end portion 69 on the side opposite to the end portion 68 in the first direction. The protective member 60 is formed so as to have a tubular shape, for example, by overlapping the end portion 68 and the end portion 69 in the radial direction of the electromagnetic wave absorbing member 80. The inner circumferential dimension of the protective member 60 can be adjusted to match the outer circumferential dimension of the electromagnetic wave absorbing member 80 by, for example, adjusting the overlapping width between the end portion 68 and the end portion 69. The protective member 60 has an elasticity according to which it is possible to return from a tubular state of being able to surround the outer circumference of the electromagnetic wave absorbing member 80 to a sheet state of not surrounding the outer circumference of the electromagnetic wave absorbing member 80, for example.

The protective member 60 is fixed to the outer circumference of the corrugated tubes 40 and 50 by, for example, the coupling members 65 and 66 shown in FIG. 2, whereby the tubular state is maintained. As the coupling members 65 and 66, for example, a tape member, a cable tie, a caulking band, or the like can be used.

Next, a configuration used in the case where tape members 65A and 66A are respectively used as the coupling members 65 and 66 will be described with reference to FIG. 9.

The tape member 65A is formed, for example, so as to fix the end portion in the length direction of the protective member 60 to the outer circumferential surface of the corrugated tube 40. The tape member 66A is formed, for example, so as to fix the end portion in the length direction of the protective member 60 to the outer circumferential surface of the corrugated tube 50.

The tape member 65A is wound, for example, over the outer circumferential surface of the end portion in the length direction of the protective member 60 and the outer circumferential surface of the corrugated tube 40 exposed from the protective member 60. The tape member 65A is continuously wound around the range from the outer circumferential surface of the protective member 60 to the outer circumferential surface of the corrugated tube 40, for example.

The tape member 65A has, for example, an overlap winding structure. The tape member 65A is wound around the outer circumference of the end portion of the protective member 60 such that the tubular state of the protective member 60 is maintained, for example.

The tape member 66A is wound, for example, over the outer circumferential surface of the end portion in the length direction of the protective member 60 and the outer circumferential surface of the corrugated tube 50 exposed from the protective member 60. The tape member 66A is continuously wound around the range from the outer circumferential surface of the protective member 60 to the outer circumferential surface of the corrugated tube 50, for example. The tape member 66A has, for example, an overlap winding structure. The tape member 66A is wound around the outer circumference of the end portion of the protective member 60 so that the tubular state of the protective member 60 is maintained, for example.

An adhesive layer or a pressure-sensitive adhesive layer may be provided on one surface of the protective member 60 shown in FIG. 8. For example, an adhesive layer or a pressure-sensitive adhesive layer may be provided on one surface of the end portion 69 of the protective member 60. According to this configuration, when the end portion 69 is overlaid on the end portion 68 of the protective member 60, the end portion 69 can be adhered to the end portion 68 by an adhesive layer or a pressure-sensitive adhesive layer. As a result, it is possible to preferably suppress a case in which the protective member 60 returns to the sheet state in a stage prior to being fixed by the tape members 65A and 66A (see FIG. 9).

As the material of the protective member 60 of the above-described embodiment, for example, a material with more excellent impact resistance and a more excellent cushioning property than the corrugated tubes 40 and 50 can also be used. For example, as the material of the protective member 60, for example, a material having more excellent sound absorption than the corrugated tubes 40 and 50 can be used. As the material of such a protective member 60, for example, a porous material can be used. As the material of the protective member 60, for example, a foamed resin can be used. The bubble structure in the foamed resin may be an open cell structure or a closed cell structure. As the material of the protective member 60, for example, urethane foam, polyethylene foam, ethylene-propylene-diene rubber foam, or the like can be used. By using the material described above as the material of the protective member 60, it is possible to suitably cause the protective member 60 to function as a cushioning member.

According to this configuration, the protective member 60 serving as a cushioning member can be interposed between the electromagnetic wave absorbing member 80 and its peripheral components. As a result, it is possible to suppress the generation of abnormal noise caused by contact between the electromagnetic wave absorbing member 80 and the peripheral components.

In the above-described embodiment, the covering member 70 was embodied in a structure having a slit 71 extending along the length direction of the wires 20, but there is no limitation to this.

For example, as shown in FIG. 8, the covering member 70 may also be embodied in a tubular structure having no slit extending along the length direction of the wires 20. The covering member 70 of this modified example is formed so as to surround the outer circumference of the plurality of wires 20 over the entire circumference in the circumferential direction. For example, the covering member 70 of this modified example is already formed as a cylinder from the state before the wires 20 are arranged inside.

In the above-described embodiment, the covering member 70 was embodied in a twist tube, but the present disclosure is not limited to this. The covering member 70 is not particularly limited as long as it is an outer cover member capable of covering the outer circumference of the wires 20, and may be constituted by, for example, a corrugated tube. The corrugated tube in this case may have a slit extending along the length direction of the wires 20, or may have no slit. Also, the covering member 70 may be, for example, a tape member. The tape member in this case is wound around, for example, the outer circumferential surface of the wires 20.

Figure 9:
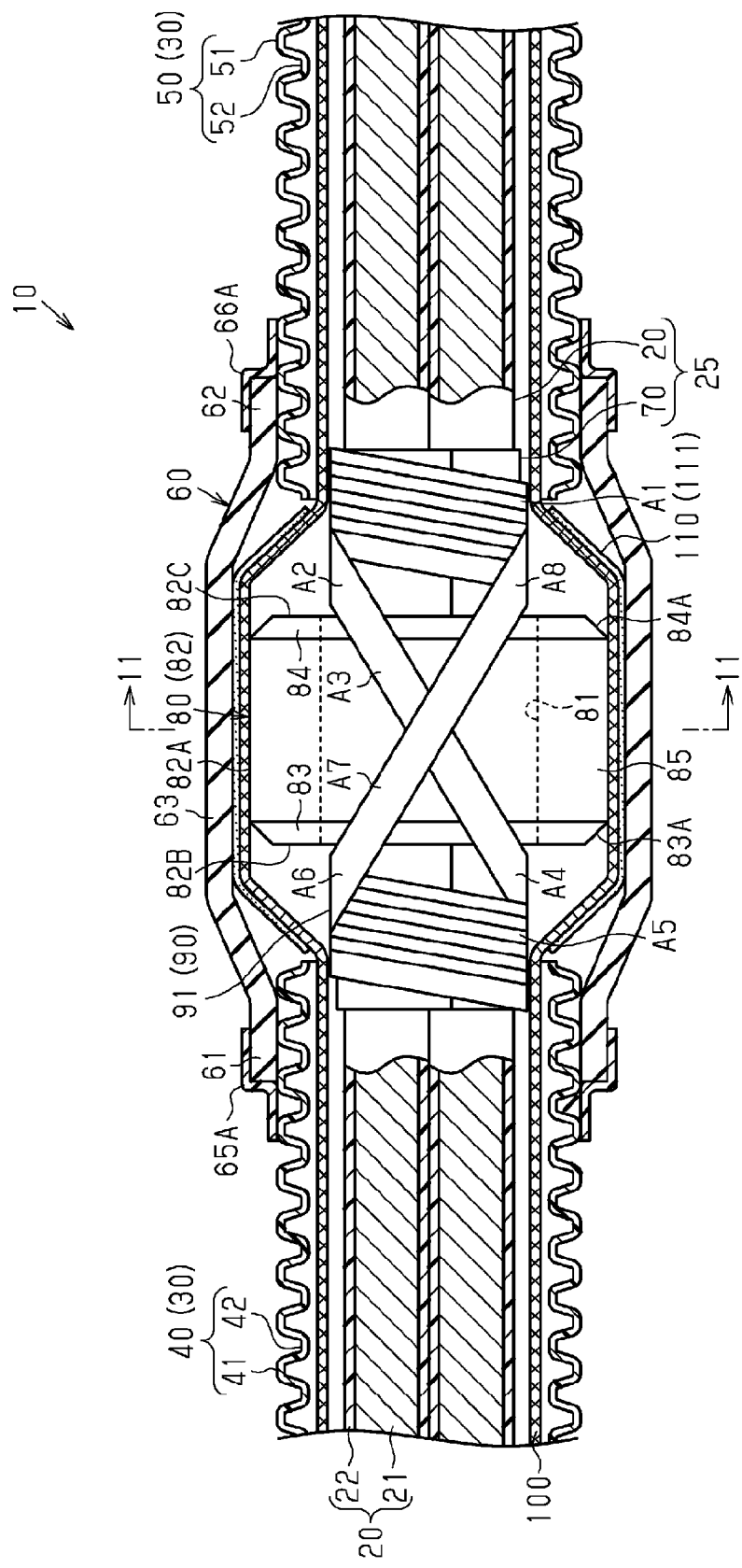
FIG. 9 is a schematic cross-sectional view showing a wire harness according to a modified example.

For example, as shown in FIG. 9, the end portion in the length direction of the covering member 70 may be accommodated in the internal space of the corrugated tube 40. In this case, a portion of the fixing member 90 may be accommodated in the internal space of the corrugated tube 40.

For example, as shown in FIG. 9, the end portion in the length direction of the covering member 70 may be accommodated in the internal space of the corrugated tube 50. In this case, a portion of the fixing member 90 may be accommodated in the internal space of the corrugated tube 50.

In the above-described embodiment, the tape member 91 was wound so as to cover the end portion in the length direction of the covering member 70, but there is no limitation to this. That is, in the above-described embodiment, the tape member 91 was formed so as to be continuously wound around the range from the outer circumferential surface of the electromagnetic wave absorbing member 80 to the outer circumferential surface of the wire 20, but there is no limitation to this. For example, the tape member 91 may be wound so as to expose the end portion in the length direction of the covering member 70. That is, the tape member 91 may be formed so as to be continuously wound around the range from the outer circumferential surface of the electromagnetic wave absorbing member 80 to the outer circumferential surface of the covering member 70.

The covering member 70 in the above-described embodiment may be omitted. In this case, the wire member 25 may be constituted by only the wires 20.

In the above-described embodiment, the fixing member 90 was formed by winding the tape member 91 so as to cover the entire outer circumferential surface 82A of the electromagnetic wave absorbing member 80, but there is no limitation to this. For example, the fixing member 90 may be formed by winding the tape member 91 so as to cover only a portion of the outer circumferential surface of the electromagnetic wave absorbing member 80.

For example, as shown in FIG. 9, the fixing member 90 of this modified example is constituted by, for example, a tape member 91 integrally having eight regions A1 to A8. The region A1 is a region in which the tape member 91 is wound around the wire member 25 in the portion led out from the through hole 81 of the magnetic core 82 to the corrugated tube 50 side. In the region A1, for example, the tape member 91 is wound multiple times around the covering member 70 that collectively surrounds the outer circumference of the plurality of wires 20, over the entire circumference in the circumferential direction. The tape member 91 in the region A1 has, for example, a function of keeping the covering member 70 in a tubular state. The tape member 91 in the region A1 has, for example, an overlap winding structure. Here, in the covering member 70 of this modification, the end portion in the length direction of the wire 20 is accommodated in the internal space of the corrugated tube 50. At this time, for example, a portion of the tape member 91 in the region A1 is accommodated in the internal space of the corrugated tube 50.

Figure 10:
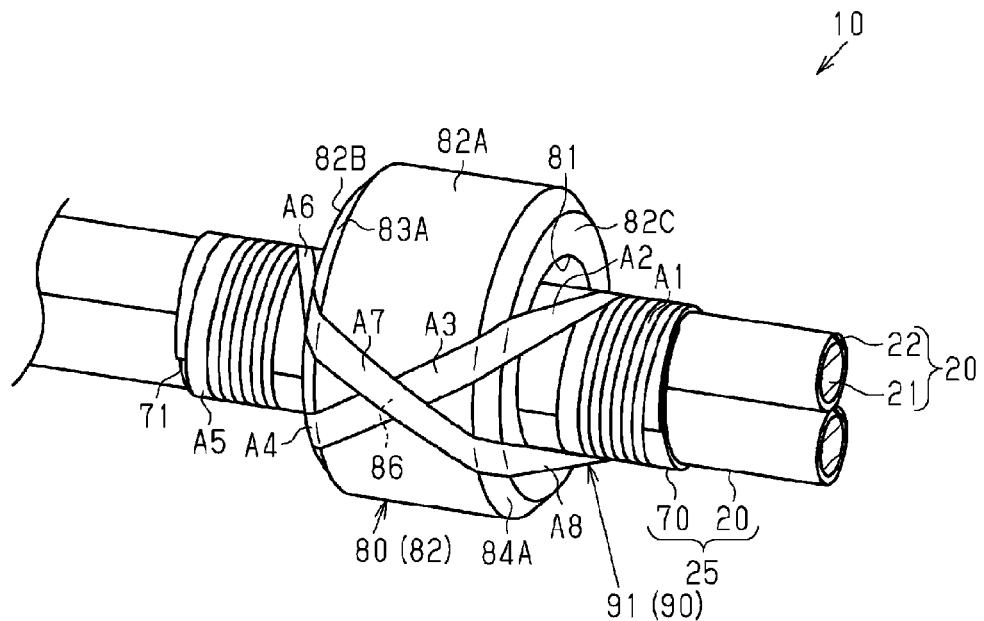
FIG. 10 is a schematic perspective view showing a wire harness according to a modified example.

As shown in FIG. 10, the region A2 is a region connected to the region A1. The region A2 is, for example, a region in which the tape member 91 extends, in a state of being tensioned with a tensile force, from the outer circumferential surface of the covering member 70 toward the outer circumferential surface 82A of the magnetic core 82. The tape member 91 in the region A2 is provided so as to bridge between the outer circumferential surface of the covering member 70 and the outer circumferential surface 82A of the magnetic core 82. The tape member 91 in the region A2 is provided, for example, so as to oppose the side surface 82C of the magnetic core 82.

The region A3 is a region connected to the region A2. The region A3 is, for example, a region in which the tape member 91 is wound around the outer circumferential surface 82A of the magnetic core 82. The tape member 91 in the region A3 covers, for example, a portion of the outer circumferential surface 82A of the magnetic core 82. The tape member 91 in the region A3 is adhered to, for example, a portion of the outer circumferential surface 82A of the magnetic core 82.

As shown in FIG. 9, the region A4 is a region coupled to the region A3. The region A4 is, for example, a region in which the tape member 91 extends, in a state of being tensed with a tension force, from the outer circumferential surface 82A of the magnetic core 82 toward the outer circumferential surface of the covering member 70 at the portion led out from the through hole 81 of the magnetic core 82 to the corrugated tube 40 side. The tape member 91 in the region A4 is provided so as to bridge between the outer circumferential surface 82A of the magnetic core 82 and the outer circumferential surface of the covering member 70. The tape member 91 in the region A4 is provided, for example, so as to oppose the side surface 82B of the magnetic core 82.

The tape member 91 in the regions A2 to A4 is formed, for example, so as to intersect in the circumferential direction of the magnetic core 82 and to extend in an inclined manner so as to intersect in the length direction of the wires 20. In the tape member 91 shown in FIG. 9, the starting end of the region A2 is located on the upper side in the drawing, and extends so as to incline leftward and downward in the drawing from the starting end of the region A2 toward the terminal end of the region A4.

The region A5 is a region connected to the region A4. The region A5 is a region in which the tape member 91 is wound around the wire member 25 in the portion led out from the through hole 81 of the magnetic core 82 to the corrugated tube 40 side. In the region A5, for example, the tape member 91 is wound multiple times around the covering member 70 that collectively surrounds the outer circumference of the plurality of wires 20, over the entire circumference in the circumferential direction. The tape member 91 in the region A5 has, for example, a function of keeping the covering member 70 in a tubular state. The tape member 91 in the region A5 has, for example, an overlap winding structure.

Here, in the covering member 70 of this modified example, the end portion in the length direction of the wire 20 is accommodated in the internal space of the corrugated tube 40. At this time, for example, a portion of the tape member 91 in the region A5 is accommodated in the internal space of the corrugated tube 40.

The region A6 is a region connected to the region A5. The region A6 is, for example, a region in which the tape member 91 extends, in a state of being tensioned with a tensile force, from the outer circumferential surface of the covering member 70 toward the outer circumferential surface 82A of the magnetic core 82. The tape member 91 in the region A6 is provided so as to bridge between the outer circumferential surface of the covering member 70 and the outer circumferential surface 82A of the magnetic core 82. The tape member 91 in the region A6 is provided, for example, so as to oppose the side surface 82B of the magnetic core 82.

The region A7 is a region connected to the region A6. The region A7 is, for example, a region in which the tape member 91 is wound around the outer circumferential surface 82A of the magnetic core 82. The tape member 91 in the region A7 is formed so as to intersect the tape member 91 in the region A3, for example. The tape member 91 in the region A7 covers, for example, a portion of the outer circumferential surface 82A of the magnetic core 82. The tape member 91 in the region A7 adheres to, for example, a portion of the outer circumferential surface 82A of the magnetic core 82 and adheres to a portion of the tape member 91 in the region A3.

The region A8 is a region connected to the region A7. The region A8 is, for example, a region in which the tape member 91 extends, in a state of being tensioned with a tensile force, from the outer circumferential surface 82A of the magnetic core 82 toward the region A1. The tape member 91 in the region A8 is provided so as to bridge between the outer circumferential surface 82A of the magnetic core 82 and the outer circumferential surface of the covering member 70. The tape member 91 in the region A8 is provided, for example, so as to oppose the side surface 82C of the magnetic core 82.

The tape member 91 in the regions A6 to A8 is formed, for example, so as to intersect in the circumferential direction of the magnetic core 82 and to extend in an inclined manner so as to intersect in the length direction of the wires 20. The tape member 91 in the regions A6 to A8 is formed so as to intersect the tape member 91 in the regions A2 to A4, for example. The tape member 91 in the regions A6 to A8 is formed so as to overlap with portions of the tape member 91 in the regions A2 to A4, for example. In the tape member 91 shown in FIG. 9, the starting end of the region A6 is located on the upper side in the drawing, and the tape member 91 extends so as to be inclined rightward and downward in the drawing from the starting end of the region A6 toward the terminal end of the region A8.

Figure 11:
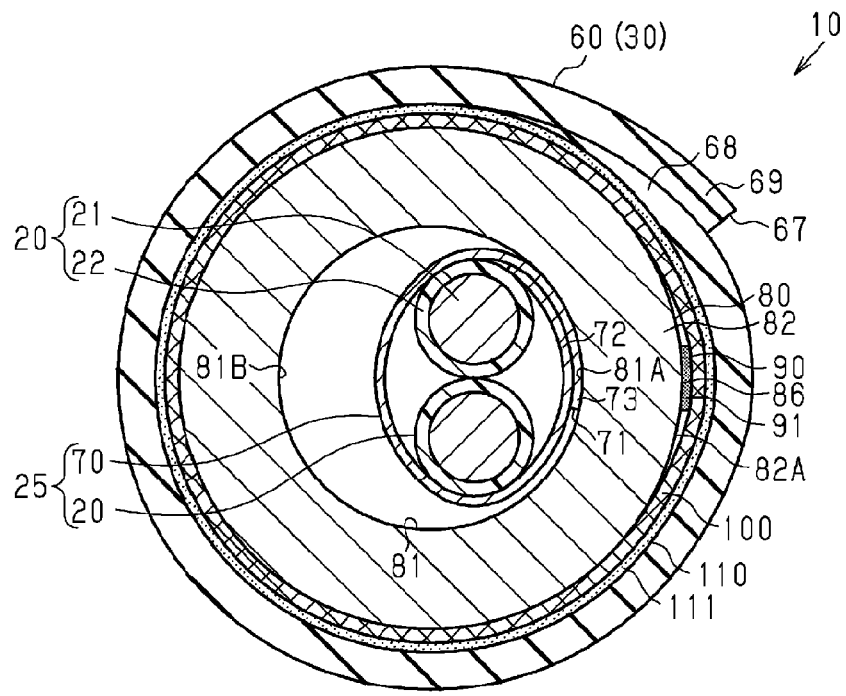
FIG. 11 is a schematic transverse cross-sectional view (a cross-sectional view taken along line 11-11 in FIG. 9) showing a wire harness according to a modified example.

As shown in FIGS. 10 and 11, for example, the tape member 91 is formed so as to cover only a region 86 that is a portion of the outer circumferential surface 82A, with respect to the outer circumferential surface 82A of the magnetic core 82. The tape member 91 is formed so as to cover only the region 86, which is smaller than half of the entire outer circumferential surface 82A of the magnetic core 82, for example. The tape member 91 is formed so as to cover only the region 86, which is smaller than one-fourth of the entire outer circumferential surface 82A of the magnetic core 82, for example. The tape member 91 is formed so as to cover only the region 86, which is smaller than one-fourth of the entire circumference in the circumferential direction of the outer circumferential surface 82A of the magnetic core 82, for example.

At this time, as shown in FIG. 11, the tape member 91 is wound around the outer circumferential surfaces of the electromagnetic wave absorbing member 80 and the wire member 25 such that, for example, inside the through hole 81 of the electromagnetic wave absorbing member 80, the wire member 25 is arranged offset to a portion in the circumferential direction of the through hole 81. For example, the wire member 25 is in contact with the first portion 81A and is separated from the second portion 81B inside the through hole 81. Here, the first portion 81A with which the wire member 25 comes into contact is provided at a position nearer to the region 86, which is the outer circumferential surface of the electromagnetic wave absorbing member 80 covered with the tape member 91, than the second portion 81B in the direction intersecting the central axis direction of the electromagnetic wave absorbing member 80. The first portion 81A is, for example, the inner circumferential surface of the through hole 81 of the portion corresponding to the region 86 in the circumferential direction of the electromagnetic wave absorbing member 80. For example, the first portion 81A is a portion located at the same angle as the region 86 of the outer circumferential surface 82A of the magnetic core 82 in the circumferential direction of the magnetic core 82. For example, the first portion 81A is a portion of the inner circumferential surface of the through hole 81 located on the underside of the region 86. The tape member 91 of this modified example fixes the electromagnetic wave absorbing member 80 to the outer circumference of the wire member 25, for example, such that the covering member 70 of the wire member 25 is brought into contact with the first portion 81A inside the through hole 81 and is arranged offset to the first portion 81A side (region 86 side). The plurality of wires 20 of this modified example are provided so as to be arranged side by side in a direction intersecting a straight line connecting the first portion 81A and the second portion 81B, for example. Note that the wire member 25 is arranged, for example, in the same direction over the entire length of the through hole 81 in the central axis direction, that is, offset to the region 86 side.

According to this configuration, the tape member 91 is formed so as to cover only a portion in the circumferential direction of the outer circumferential surface 82A of the electromagnetic wave absorbing member 80. This makes it possible to, for example, shorten the length of the tape member 91 compared to the case where the tape member 91 is formed so as to cover the outer circumferential surface 82A of the electromagnetic wave absorbing member 80 over the entire circumference in the circumferential direction. As a result, the manufacturing cost of the wire harness 10 can be reduced.

Next, a method for manufacturing the wire harness 10 of this modified example will be described. Here, an example of how to wind the tape member 91 serving as the fixing member 90 will be described.

Figure 12:
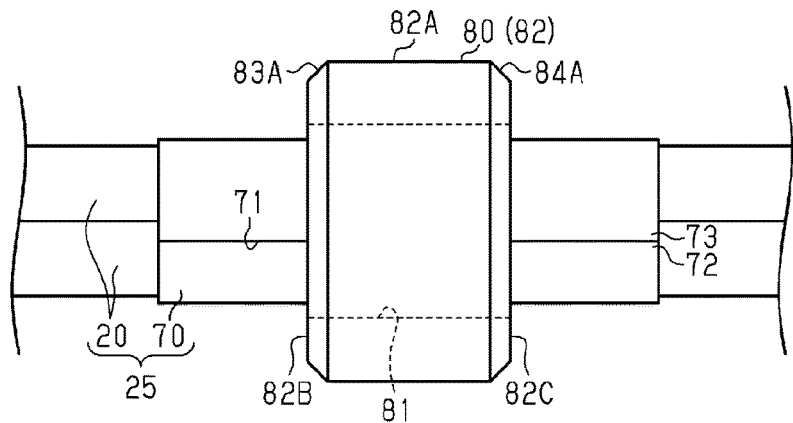
FIG. 12 is a schematic side view showing a method for manufacturing a wire harness according to a modified example.

In the step shown in FIG. 12, the sheet-shaped covering member 70 is wound in the circumferential direction of the wires 20 to form a tubular covering member 70 that collectively surrounds the outer circumference of the plurality of wires 20. Next, the covering member 70 surrounding the plurality of wires 20 is passed through the through hole 81 of the magnetic core 82.

Figure 13:
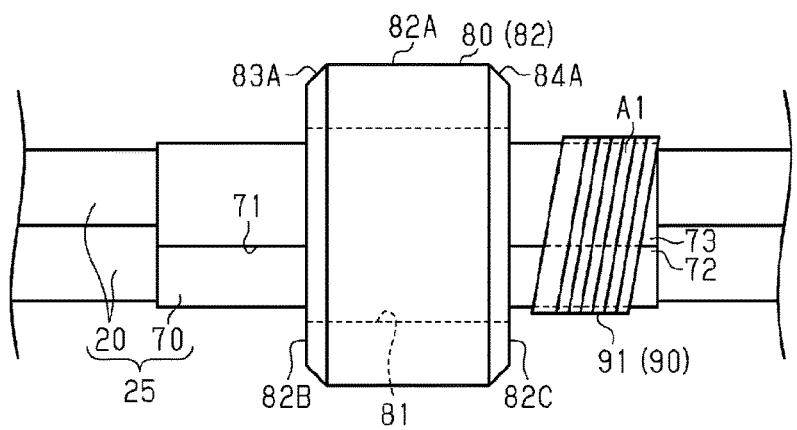
FIG. 13 is a schematic side view showing a method for manufacturing a wire harness according to a modified example.

Next, in the step shown in FIG. 13, the tape member 91 is wound around the covering member 70 led out from the through hole 81 to one side. The tape member 91 is wound a plurality of times around the covering member 70 over the entire circumference in the circumferential direction using, for example, a half-wrap winding structure. As a result, the region A1 of the fixing member 90 is formed. Also, the covering member 70 is kept in a tubular state by winding the tape member 91 around the covering member 70.

Figure 14:
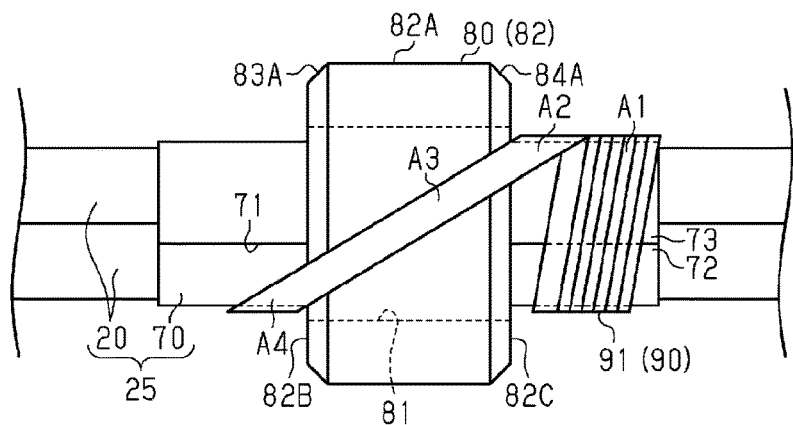
FIG. 14 is a schematic side view showing a method for manufacturing a wire harness according to a modified example.

Next, in the step shown in FIG. 14, the tape member 91 pulled out from the region A1 is adhered to the outer circumferential surface 82A of the magnetic core 82 while extending with a tensile force applied, to the outer circumferential surface of the covering member 70 led out from the through hole 81 to the side opposite to the region A1. At this time, the tape member 91 is extended so as to be inclined with respect to the length direction of the wires 20. As a result, the region A2, the region A3, and the region A4 of the fixing member 90 are formed.

Figure 15:
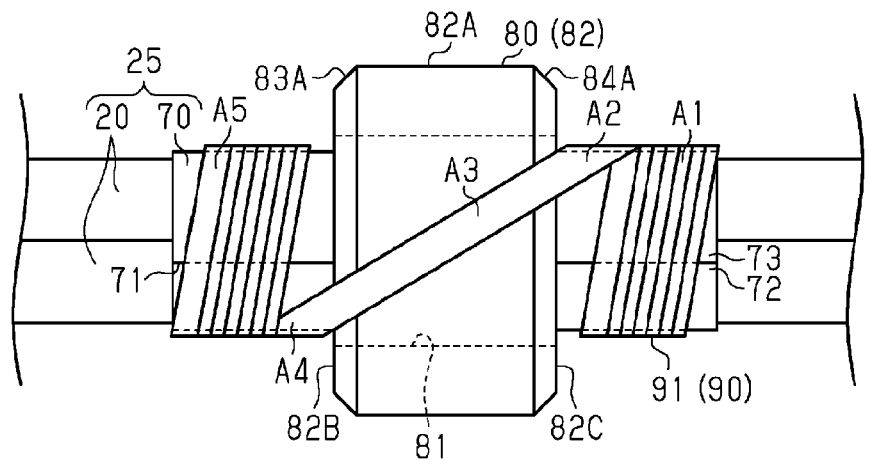
FIG. 15 is a schematic side view showing a method for manufacturing a wire harness according to a modified example.

Next, in the step shown in FIG. 15, the tape member 91 is wound around the covering member 70 led out from the through hole 81 to the side opposite to the region A1. The tape member 91 is wound a plurality of times around the covering member 70 over the entire circumference in the circumferential direction using, for example, a half-wrap winding structure. As a result, the region A5 of the fixing member 90 is formed.

Figure 16:
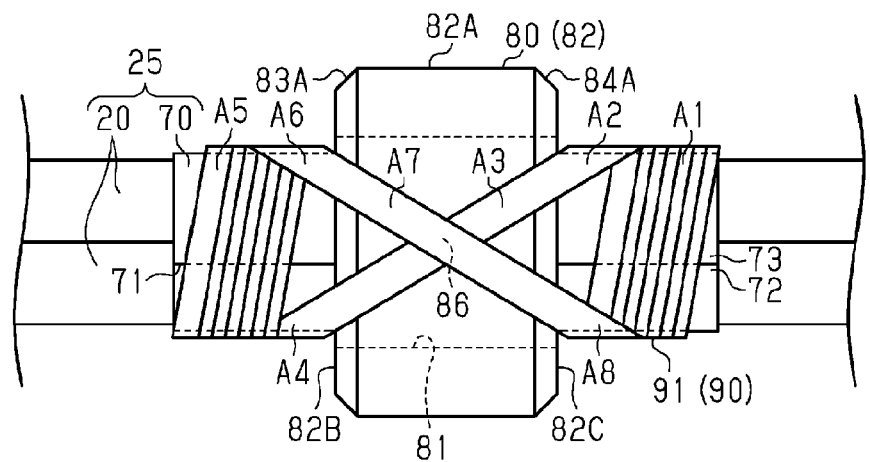
FIG. 16 is a schematic side view showing a method for manufacturing a wire harness according to a modified example.

Next, in the step shown in FIG. 16, while the tape member 91 pulled out from the region A5 is attached to the outer circumferential surface 82A of the magnetic core 82, the tape member 91 is extended with tension applied, to the outer circumferential surface of the covering member 70 in the region A1. At this time, the tape member 91 is extended so as to be inclined with respect to the length direction of the wires 20, and is extended so as to intersect the tape member 91 in the regions A2 to A4. As a result, the region A6, the region A7, and the region A8 of the fixing member 90 are formed.

Through the above steps, the electromagnetic wave absorbing member 80 is fixed to the wires 20 and the covering member 70. As a result, it is possible to restrict the movement of the electromagnetic wave absorbing member 80 in the length direction of the wires 20. Also, the tape member 91 fixes the electromagnetic wave absorbing member 80 to the outer circumferential surface of the wire member 25 in a state where the wire member 25 is offset toward the region 86 inside the through hole 81.

In the above-described embodiment, the fixing member 90 was constituted by the tape member 91, but there is no limitation to this. For example, a metal band or a resin cable tie may be used as the fixing member 90.

In the above-described embodiment, the restricting member 110 was constituted by the tape member 111, but there is no limitation to this. For example, a metal band or a resin cable tie may be used as the restricting member 110.

Figure 17:
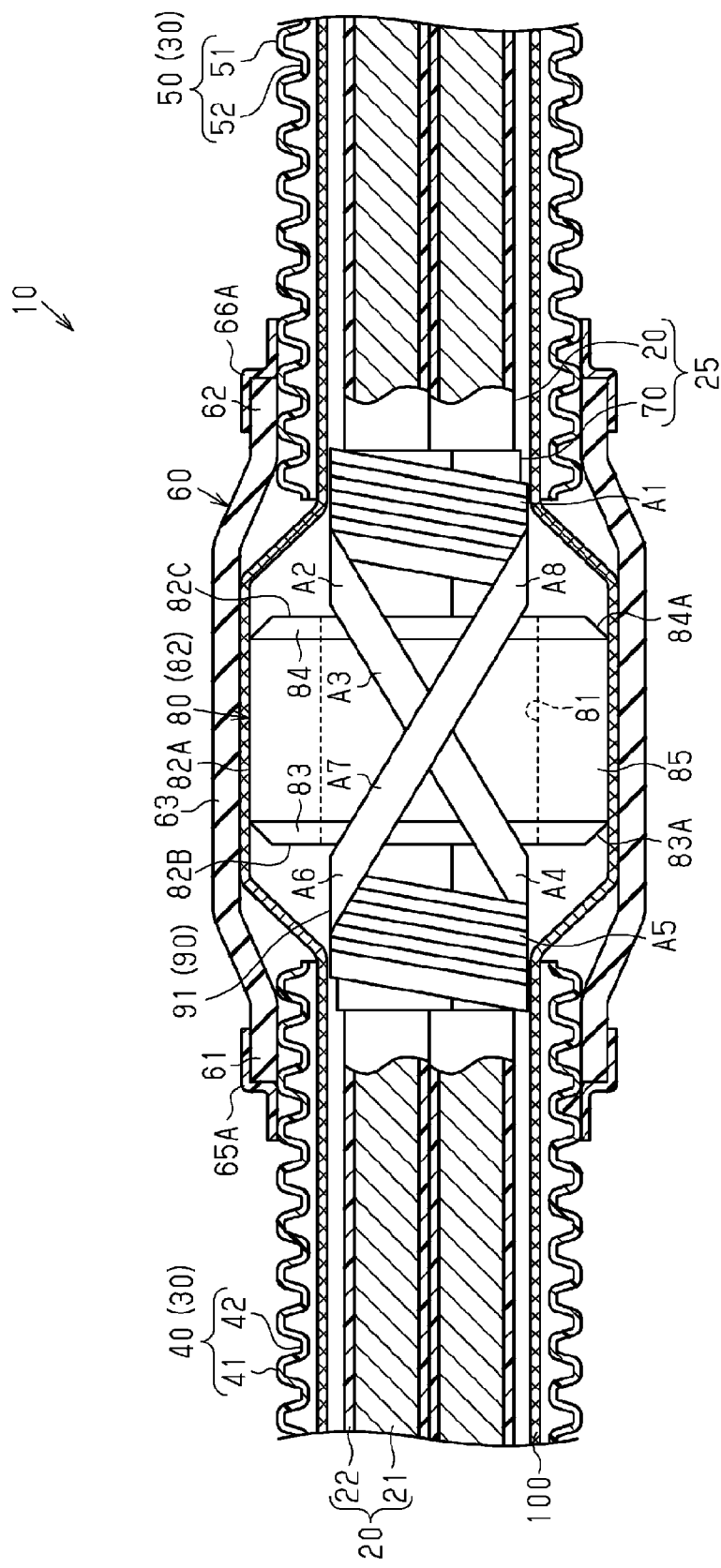
FIG. 17 is a schematic cross-sectional view showing a wire harness according to a modified example.

For example, as shown in FIG. 17, the restricting member 110 may be omitted. In this case, for example, the inner circumferential surface of the protective member 60 may be brought into contact with the outer circumferential surface of the braided member 100. In the illustrated example, the inner circumferential surface of the protective member 60 is in contact with the outer circumferential surface of the braided member 100, and the inner circumferential surface of the braided member 100 is in contact with the outer circumferential surface 82A of the magnetic core 82. At this time, on the outer circumferential surface 82A of the magnetic core 82, for example, the end portions 83 and 84 in the central axis direction of the magnetic core 82 are formed in the tapered portions 83A and 84A. For this reason, even if the braided member 100 comes into direct contact with the outer circumferential surface 82A of the magnetic core 82, it is possible to suitably suppress damage to the braided member 100 caused by wear.

In the above-described embodiment, the electromagnetic wave absorbing member 80 was constituted by only the magnetic core 82, but there is no limitation to this.

Figure 18:
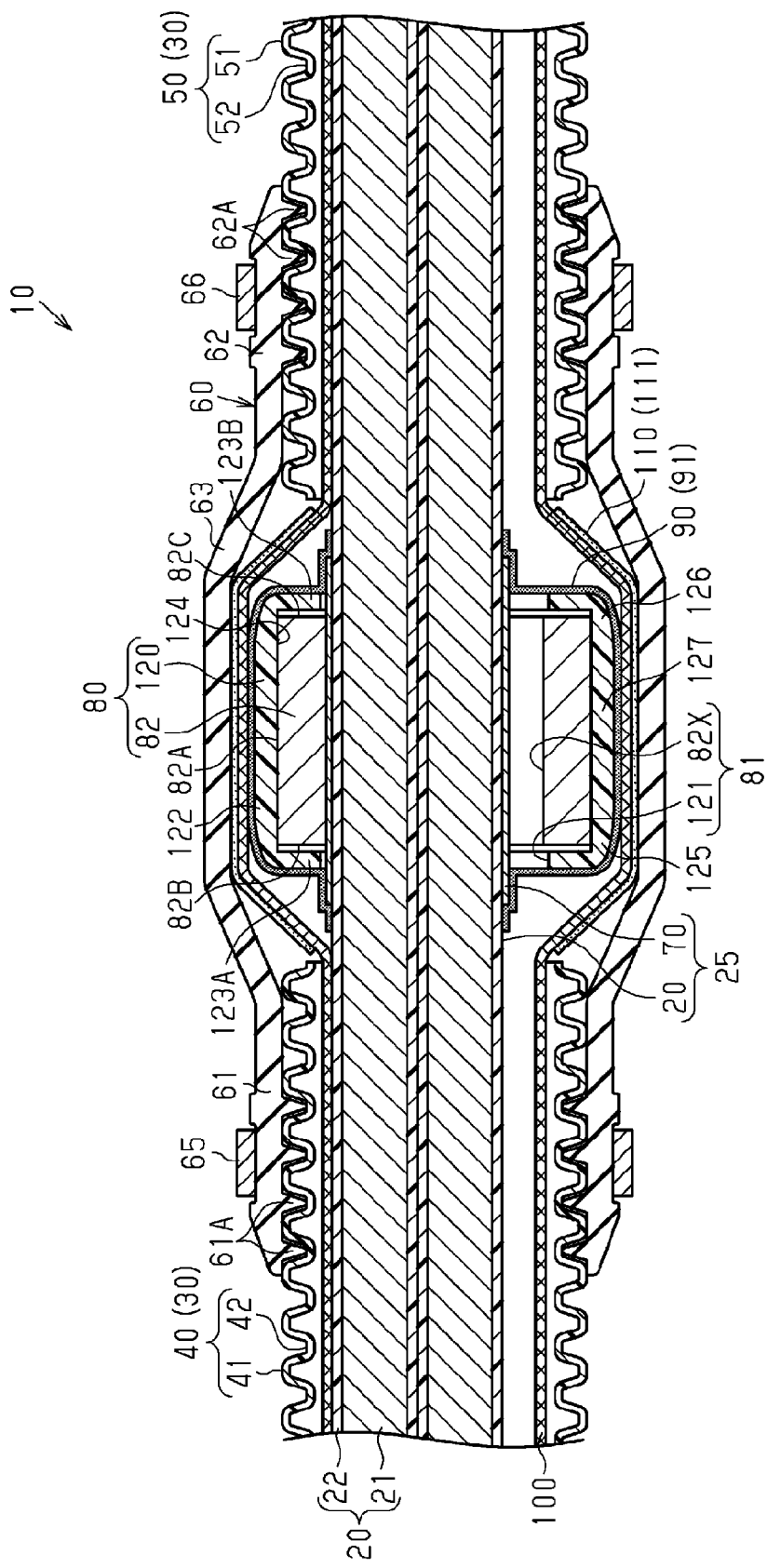
FIG. 18 is a schematic cross-sectional view showing a wire harness according to a modified example.

For example, as shown in FIG. 18, the electromagnetic wave absorbing member 80 may be configured to include a magnetic core 82 and a case 120 accommodating the magnetic core 82. Note that the material of the case 120 is, for example, an insulating material such as a synthetic resin. As the material of the case 120, for example, a synthetic resin such as polyolefin, polyamide, polyester, or ABS resin can be used.

The magnetic core 82 is formed so as to have a ring shape. The magnetic core 82 has a through hole 82X through which the plurality of wires 20 collectively pass. The magnetic core 82 has a ring shape due to having the through hole 82X. The magnetic core 82 is formed, for example, in a ring shape. The tapered portions 83A and 84A shown in FIG. 2 are not formed on the outer circumferential surface 82A of the magnetic core 82 of this modified example. For example, in the magnetic core 82, the angle formed by the outer circumferential surface 82A and the side surfaces 82B and 82C is formed to be a substantially right angle.

Configuration of Case 120

The case 120 is formed to have a ring shape. The case 120 has a through hole 121 through which a plurality of wires 20 collectively pass. The case 120 has a ring shape due to having the through hole 121. The through hole 121 communicates with the through hole 82X of the magnetic core 82. In the electromagnetic wave absorbing member 80, the through hole 81 of the electromagnetic wave absorbing member 80 is formed by the through hole 121 and the through hole 82X.

The case 120 has, for example, a ring shape in which both ends in the length direction of the wire 20 are open. The case 120 is formed in a ring shape, for example. The through hole 121 is formed so as to pass through the case 120 in the length direction, for example. The covering member 70 is provided so as to pass through the through holes 121 and 82X in a state of collectively surrounding the outer circumference of the plurality of wires 20, for example.

The case 120 has, for example, a circumferential wall 122 extending along the circumferential direction and the axial direction of the case 120, and a pair of side walls 123A and 123B that are located at both ends in the axial direction of the case 120 and extend along the radial direction of the case 120. Each of the side walls 123A and 123B is formed with through holes 121 that pass through the side walls 123A and 123B in the axial direction.

The case 120 has an accommodation portion 124 accommodating the magnetic core 82. The accommodation portion 124 is formed in a size capable of accommodating the magnetic core 82. The accommodation portion 124 is formed so as to communicate with, for example, the through hole 121. The accommodation portion 124 is constituted by, for example, a space surrounded by the inner circumferential surface of the circumferential wall 122 and the inner circumferential surfaces of the side walls 123A and 123B. The accommodation portion 124 is formed, for example, so as to surround the outer circumferential surface 82A of the magnetic core 82. For example, the circumferential wall 122 is formed so as to cover the outer circumferential surface 82A of the magnetic core 82. The inner circumferential surface of the circumferential wall 122 is formed so as to oppose, for example, the outer circumferential surface 82A of the magnetic core 82. The accommodation portion 124 is formed, for example, so as to surround the side surfaces 82B and 82C of the magnetic core 82. The side walls 123A and 123B are formed, for example, so as to cover the side surfaces 82B and 82C of the magnetic core 82, respectively. The inner circumferential surfaces of the side walls 123A and 123B are formed, for example, so as to oppose the side surfaces 82B and 82C of the magnetic core 82, respectively.

The case 120 is fixed to the outer circumference of the wire member 25 by the fixing member 90 in a state where the magnetic core 82 is accommodated in the accommodation portion 124, for example. At this time, the magnetic core 82 is held by, for example, the accommodation portion 124 of the case 120 and the outer circumferential surface of the covering member 70.

The circumferential wall 122 has, for example, an end portion 125 in the central axis direction of the through hole 121, an end portion 126 on the opposite side in the central axis direction from the end portion 125, and a central portion 127 that is provided between the end portion 125 and the end portion 126. The end portion 125 is an end portion provided on the corrugated tube 40 side out of the two end portions in the central axis direction of the case 120. The end portion 126 is an end portion provided on the corrugated tube 50 side out of the two end portions in the central axis direction of the case 120. The circumferential wall 122 has, for example, an outer circumferential surface extending along the circumferential direction and the axial direction of the case 120.

The end portion 125 of the circumferential wall 122 is formed such that that the outer shape becomes smaller toward the side wall 123A from the central portion 127 side, for example. The outer circumferential surface of the end portion 125 is formed in a tapered shape whose outer shape becomes smaller toward the side wall 123A from the central portion 127 side, for example. The outer circumferential surface of the end portion 125 is formed in an inclined manner so as to approach the inner circumferential surface of the through hole 121, for example, from the central portion 127 side toward the side wall 123A. The outer circumferential surface of the end portion 125 is formed, for example, in a curved surface curved in an arc shape. The entire outer circumferential surface of the end portion 125 of this modified example is formed in a curved surface.

The end portion 126 of the circumferential wall 122 is formed such that the outer shape becomes smaller toward the side wall 123B from the central portion 127 side, for example. The outer circumferential surface of the end portion 126 is formed in a tapered shape whose outer shape becomes smaller toward the side wall 123B from the central portion 127 side, for example. The outer circumferential surface of the end portion 126 is formed in an inclined manner so as to approach the inner circumferential surface of the through hole 121, for example, from the central portion 127 side toward the side wall 123B. The outer circumferential surface of the end portion 126 is formed, for example, in a curved surface curved in an arc shape. The entire outer circumferential surface of the end portion 126 of the modified example is formed in a curved surface. The circumferential wall 122 of this modified example is formed in a curved surface in which the entire outer circumferential surface of the circumferential wall 122 is curved in an arc shape.

The case 120 may, for example, have a slit extending along the axial direction of the case 120, or may not have a slit extending along the axial direction of the case 120. The case 120 may be constituted by one component, or the case 120 may be constituted by combining a plurality of components.

For example, the fixing member 90 is continuously wound around the range from the outer circumferential surface of the case 120 of the electromagnetic wave absorbing member 80 to the outer circumferential surface of the wires 20. The fixing member 90 is formed so as to cover, for example, the outer circumferential surfaces of the end portions 125 and 126 and the central portion 127 of the case 120.

In the above-described embodiment, the magnetic core 82 was formed in a circular ring shape, but there is no limitation to this. For example, as long as the magnetic core 82 is formed in a ring shape, there is no particular limitation on its shape.

Figure 19:
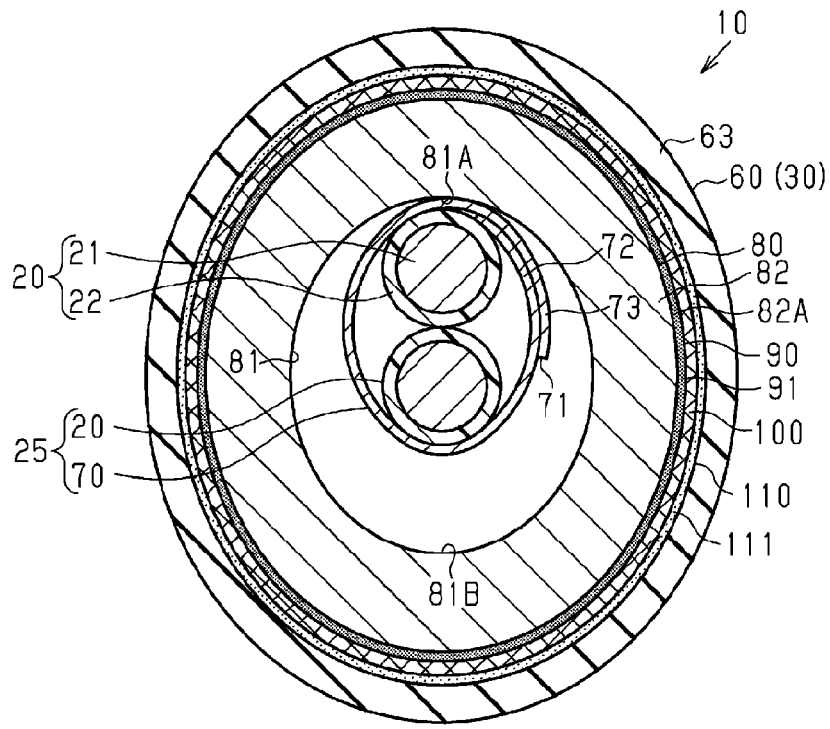
FIG. 19 is a schematic transverse cross-sectional view showing a wire harness according to a modified example.

For example, as shown in FIG. 19, the magnetic core 82 may be formed in an elliptical ring shape. The magnetic core 82 in this case has an elliptical transverse cross-sectional shape.

The formation of the tapered portions 83A and 84A in the electromagnetic wave absorbing member 80 of the above-described embodiment may be omitted.

The number and installation position of the electromagnetic wave absorbing member 80 in the above embodiment are not particularly limited. For example, two or more electromagnetic wave absorbing members 80 may be provided for the wire harness 10. For example, the electromagnetic wave absorbing member 80 may be provided outside the vehicle interior, which is a waterproof region, or the electromagnetic wave absorbing member 80 may be provided inside the vehicle interior, which is a non-waterproof region.

In the above-described embodiment, the first outer cover member (first outer cover) was embodied in the corrugated tube 40 and the second outer cover member (second outer cover) was embodied in the corrugated tube 50, but there is no limitation thereto. For example, as the first outer cover member and the second outer cover member, a hard resin pipe, a metal pipe, or a rubber waterproof cover can be used. For example, the first outer cover member and the second outer cover member may be embodied in mutually different types of outer cover members. For example, the first outer cover member may be embodied in a metal pipe, and the second outer cover member may be embodied in a corrugated tube.

In the above-described embodiment, the braided member 100 was provided so as to cover the outer circumference of the electromagnetic wave absorbing member 80, but there is no limitation to this. For example, the braided member 100 may be passed through the through hole 81 of the electromagnetic wave absorbing member 80.

Instead of the braided member 100 of the above-described embodiment, another electromagnetic shielding member (electromagnetic shield) such as metal foil may be used.

The braided member 100 of the above-described embodiment may also be omitted.

The wires 20 of the above-described embodiment may also be changed to shielded wires.

The wires 20 of the above-described embodiment may also be changed to low-voltage wires.

In the above-described embodiment, there were two wires 20 accommodated inside the outer cover member 30, but there is no particular limitation thereto, and the number of wires 20 can be changed according to the specification of the vehicle V. For example, the number of wires 20 accommodated inside the outer cover member 30 may be one or three or more. For example, as a wire accommodated in the outer cover member 30, a low-voltage wire for connecting a low-voltage battery and various low-voltage devices (e.g., a lamp, car audio, etc.) may be added.

The arrangement relationship between the inverter 11 and the high-voltage battery 12 in the vehicle V is not limited to the above-described embodiment, and may be appropriately changed according to the vehicle configuration.

Figure 20:
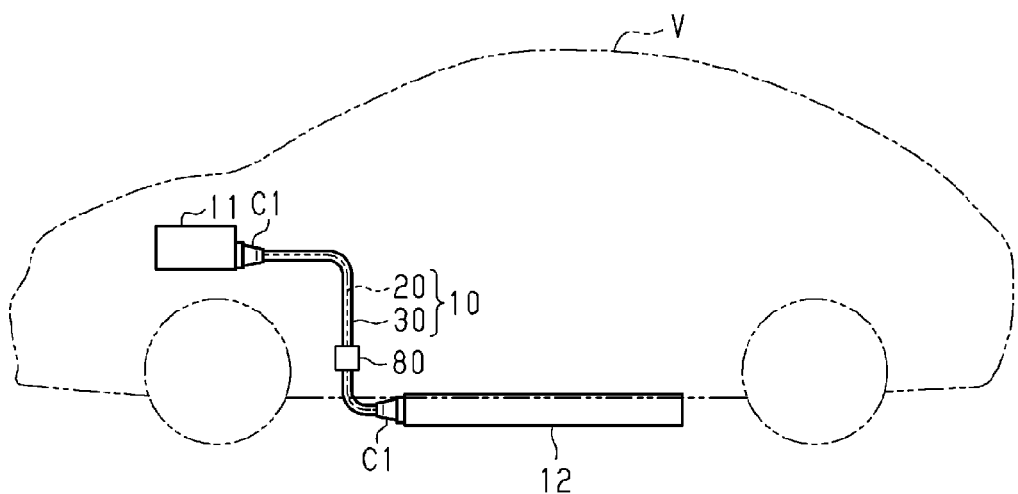
FIG. 20 is a schematic configuration diagram showing a wire harness according to a modified example.

For example, as shown in FIG. 20, the high-voltage battery 12 may be arranged on approximately the entirety of the floor of the vehicle V and may be embodied in a wire harness 10 that electrically connects the high-voltage battery 12 and the inverter 11.

In the above-described embodiment, the inverter 11 and the high-voltage battery 12 were adopted as the electric devices connected by the wire harness 10, but there is no limitation to this. For example, the present disclosure may be adopted in a wire connecting the inverter 11 and the motor for driving the wheels. That is, the present disclosure is applicable as long as it electrically connects electric devices mounted in the vehicle V.

In some cases, the electromagnetic wave absorbing member 80 of the embodiment is referred to as an electromagnetic noise filter attached to the wire 20 coaxially with the wire 20 at a predetermined position in the axial direction of the wire 20. In some cases, the predetermined position in the axial direction of the wire 20 to which the electromagnetic wave absorbing member 80 is attached is referred to as an electromagnetic noise filter attachment position.

As in the embodiment shown in the drawings, the opening terminal end portion of the first outer cover member 40 may be separated with a space from the opening terminal end portion of the second outer cover member 50. The predetermined position in the axial direction of the wires 20 may be positioned in the axial direction gap formed between the opening terminal end portion of the first outer cover member 40 and the opening terminal end portion of the second outer cover member 50. The opening terminal end portion of the first outer cover member 40 may face the side surface 82B of the electromagnetic wave absorbing member 80, and the opening terminal end portion of the second outer cover member 50 may face the side surface 82C of the electromagnetic wave absorbing member 80.

The protective member 60 of the embodiment shown in the drawings may be configured as a continuous tubular body that couples the opening terminal end portion of the first outer cover member 40 and the opening terminal end portion of the second outer cover member 50 such that the opening terminal end portion of the first outer cover member 40 and the opening terminal end portion of the second outer cover member 50 are spaced apart from each other by a gap in the axial direction. The protective member 60 of the illustrated embodiment may have a first tubular end portion configured to be attached to the outer surface in the radial direction of the opening terminal end portion of the first outer cover member 40, a second tubular end portion configured to be attached to the outer surface in the radial direction of the opening terminal end portion of the second outer cover member 50, and a tubular intermediate portion that extends between the first tubular end portion and the second tubular end portion. In one example, the tubular intermediate portion may be configured such that the gap in the axial direction formed between the opening terminal end portion of the first outer cover member 40 and the opening terminal end portion of the second outer cover member 50 is not exposed to the outside of the wire harness 10. In the embodiment shown in the drawings, the tubular intermediate portion of the protective member 60 may be configured to cover the entirety of the electromagnetic wave absorbing member 80 sandwiched between the opening terminal end portion of the first outer cover member 40 and the opening terminal end portion of the second outer cover member 50, and the exposed portion of the braided member 100 that is not covered by the first outer cover member 40 and the second outer cover member 50.

In the embodiment, the overlapping between the end portion 72 and the end portion 73 of the covering member 70 may be non-adhesive overlapping, and for example, may be frictional overlapping. The covering member 70 may be referred to as a roll of elastically-resilient resin that is attached to a predetermined length position of one or more wires 20.

The embodiments disclosed herein are to be considered exemplary in all respects and not restrictive. The scope of the present disclosure is indicated by the scope of claims, not the above-mentioned meaning, and is intended to encompass all modifications within the meaning and range of equivalency to the claims.

The invention claimed is:

1. A wire harness comprising:
a wire member comprising:
    a wire; and
    a cover that covers an outer circumference of the wire;
a ring-shaped electromagnetic wave absorber including a through hole through which the wire member passes; and
a fixing member for fixing the electromagnetic wave absorber to the wire member, wherein
an inner circumferential surface of the through hole opposes an outer circumferential surface of the wire member,
in a view of the electromagnetic wave absorber along a central axis of the through hole, the inner circumferential surface of the through hole has a first portion and a second portion arranged at a position point-symmetrical to the first portion with respect to the central axis of the through hole,
the fixing member fixes the electromagnetic wave absorber to the wire member such that the wire member is in contact with the first portion and is separated from the second portion;
the fixing member is formed by winding one tape member,
the fixing member comprises:
    a first region in which the tape member is wound around the outer circumferential surface of the wire member led out to one side from the through hole;
    a second region formed such that the tape member drawn outward from the first region is adhered to an outer circumferential surface of the electromagnetic wave absorber and extends to the wire member led out to the other side from the through hole;
    a third region in which the tape member is wound around the outer circumferential surface of the wire member led out to the other side from the through hole; and
    a fourth region formed such that the tape member drawn outward from the third region is adhered to the outer circumferential surface of the electromagnetic wave absorber and extends to the first region,
the tape member in the fourth region is formed so as to extend intersecting the tape member in the second region,
the tape member is formed so as to cover only a small portion in an entire circumferential direction of the outer circumferential surface of the electromagnetic wave absorber, and
the first portion is a portion arranged at a position that is nearer to the outer circumferential surface of the electromagnetic wave absorber covered by the tape member than the second portion, in a direction intersecting a central axis direction in which the central axis of the through hole extends.

2. The wire harness according to claim 1, wherein
the cover is formed in a sheet shape having a slit extending along a length direction of the wire member,
the cover has a first end in a first direction intersecting the length direction of the wire member, and a second end provided on a side opposite to the first end in the first direction,
the cover is formed so as to have a tubular shape surrounding the outer circumferential surface of the wire member over an entire circumference of the wire member in a circumferential direction of the wire member by overlapping the second end on the first end, and
the fixing member is provided so as to surround an outer circumference of the cover over the entire circumference of the wire member in the circumferential direction of the wire member.

3. The wire harness according to claim 1, further comprising:
a tubular electromagnetic shield covering the outer circumferential surface of the wire member and an outer circumferential surface of the electromagnetic wave absorber.

4. The wire harness according to claim 3, wherein
the fixing member is provided between the electromagnetic wave absorber and the electromagnetic shield in a direction intersecting the central axis direction, and
the fixing member covers an outer circumferential surface of the electromagnetic wave absorber and covers the outer circumferential surface of the wire member.

5. The wire harness according to claim 4, further comprising:
a first outer cover that accommodates the wire member;
a second outer cover that accommodates the wire member and is provided spaced apart from the first outer cover in a length direction of the wire member; and
a protective member that covers the outer circumferential surface of the electromagnetic wave absorber and is fixed so as to bridge between the outer circumference of the first outer cover and the outer circumference of the second outer cover, and
the electromagnetic wave absorber is provided between the first outer cover and the second outer cover in the length direction of the wire member.

6. The wire harness according to claim 5, wherein
- an inner circumferential surface of the protective member is in contact with an outer circumferential surface of the electromagnetic shield, and
- an inner circumferential surface of the electromagnetic shield is in contact with the tape member covering the outer circumferential surface of the electromagnetic wave absorber.

7. The wire harness according to claim 5, further comprising:
- a restricting member that covers an outer circumferential surface of the electromagnetic shield exposed from the first outer cover and the second outer cover and restricts expansion in a radial direction of the electromagnetic shield.

* * * * *